(12) United States Patent
Lin et al.

(10) Patent No.: US 12,178,050 B2
(45) Date of Patent: Dec. 24, 2024

(54) THREE-DIMENSIONAL SEMICONDUCTOR MEMORY DEVICES AND METHODS OF MANUFACTURING THE SAME

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 323 days.

(21) Appl. No.: 17/584,797

(22) Filed: Jan. 26, 2022

(65) Prior Publication Data

US 2023/0011604 A1    Jan. 12, 2023

Related U.S. Application Data

(60) Provisional application No. 63/220,202, filed on Jul. 9, 2021.

(51) Int. Cl.
| | |
|---|---|
| *H10B 53/30* | (2023.01) |
| *H10B 43/20* | (2023.01) |
| *H10B 43/30* | (2023.01) |
| *H10B 51/20* | (2023.01) |
| *H10B 51/30* | (2023.01) |
| *H10B 53/20* | (2023.01) |

(52) U.S. Cl.
CPC ............ *H10B 53/30* (2023.02); *H10B 43/20* (2023.02); *H10B 43/30* (2023.02); *H10B 51/20* (2023.02); *H10B 51/30* (2023.02); *H10B 53/20* (2023.02)

(58) Field of Classification Search
CPC ........ H10B 43/10; H10B 43/20; H10B 43/30; H10B 51/10; H10B 51/20; H10B 51/30; H10B 53/10; H10B 53/20; H10B 53/30
See application file for complete search history.

(56) References Cited

U.S. PATENT DOCUMENTS

2020/0111916 A1*  4/2020  Karda ............... H01L 21/02565

FOREIGN PATENT DOCUMENTS

WO    WO-2022261827 A1 *  12/2022

* cited by examiner

*Primary Examiner* — Matthew E Warren
(74) *Attorney, Agent, or Firm* — FOLEY & LARDNER LLP

(57) ABSTRACT

A semiconductor device includes a first memory cell that includes: a first conductor structure extending along a first lateral direction; a first portion of a first memory film wrapping around a first portion of the first conductor structure; a first semiconductor film wrapping around the first portion of the first memory film; a second conductor structure extending along a vertical direction and coupled to a first sidewall of the first semiconductor film, wherein the first sidewall faces toward or away from a second lateral direction perpendicular to the first lateral direction; and a third conductor structure extending along the vertical direction and coupled to a second sidewall of the first semiconductor film, wherein the second sidewall faces toward or away from the second lateral direction.

20 Claims, 30 Drawing Sheets

THREE-DIMENSIONAL SEMICONDUCTOR MEMORY DEVICES AND METHODS OF MANUFACTURING THE SAME

CROSS-REFERENCE TO RELATED APPLICATION

This application claims priority to and the benefit of U.S. Provisional Application No. 63/220,202, filed Jul. 9, 2021, entitled "3D MEMORY STRUCTURE," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
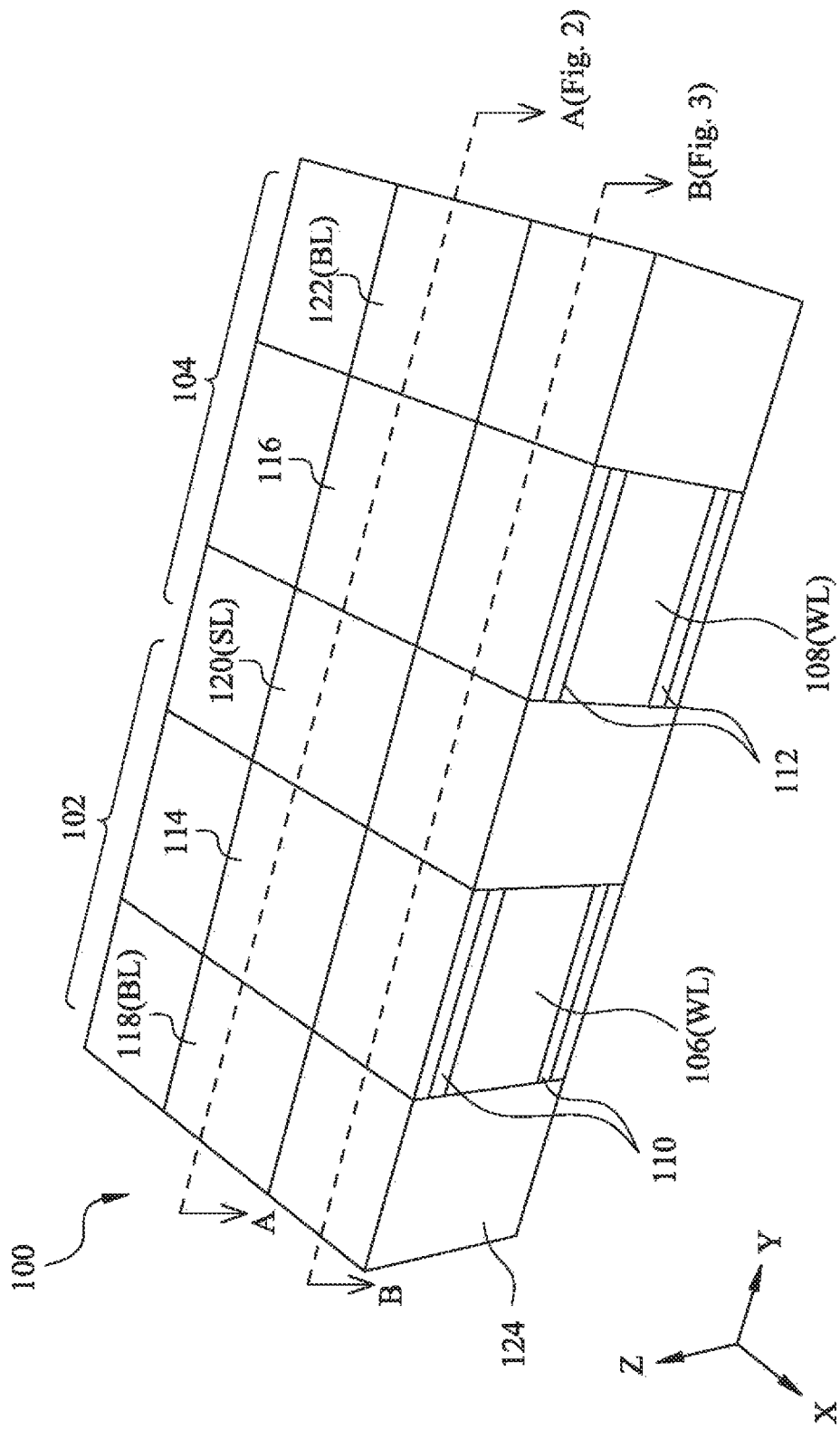
FIG. 1 illustrates a perspective view of a 3D memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, there are two main classes of components in complementary metal oxide semiconductor (CMOS) integrated circuits (ICs), namely transistors and wires. With "scaling," transistor performance and density typically improve, which can contribute to the increases in IC performance and functionality. However, wires (interconnects) that connect together transistors degrade in performance with such scaling. The situation is typically that wires can contribute a major portion of the performance, functionality and power consumption of ICs. Three-dimensional (3D) stacking of semiconductor devices or chips is one avenue to tackle the wire issues. By arranging transistors in 3 dimensions instead of 2 dimensions, the transistors in ICs can be placed closer to each other. This reduces wire lengths and keeps wiring delay low.

For example, a 3D memory device in which memory cells are stacked in a vertical direction over a substrate have been proposed. Such a 3D memory device general includes a number of memory cells formed as a number memory strings. The memory cells of each memory string are vertically disposed in different layers/levels, respectively, and thus, are controlled (e.g., gated) by respective different access lines (e.g., word lines (WLs)). However, the memory cells share a same (e.g., semiconductor) channel. Alternative stated, the shared semiconductor channel vertically extends across multiple WLs, with some portions adjacent (or operatively coupled to) respective WLs and some portions not adjacent (or not operatively coupled to) any of the WLs. With such a configuration, a certain amount of leakage current can be induced along the "uncoupled" portions of the channel, which can significantly degrade performance (e.g., a reading window) of the device. Thus, the existing 3D memory devices have not been entirely satisfactory in every aspect.

Embodiments of the present disclosure are discussed in the context of forming a semiconductor device, and particularly in the context of forming a 3D memory device. The 3D memory device, as disclosed herein, includes a number of memory strings, each of which includes a number of memory cells disposed in different memory levels, respectively. Different from the existing 3D memory devices, the memory string includes a number of semiconductor channels disposed in the memory levels, respectively. Stated another way, the memory cells of a memory string have their semiconductor channels disposed in respective memory levels and not extending to other memory level. Further, each of the semiconductor channels may be formed as closed-ended film that wraps around a respective access line (e.g., a WL) functioning as a gate, in various embodiments. As such, electrical fields induced by each of the gates can be confined within the corresponding channel, which can significantly resolve the leakage issues commonly observed in the existing 3D memory devices. Still further, laterally adjacent memory strings of the currently disclosed 3D memory device can share an access line (e.g., a source line (SL)), which is sometimes referred to as a common-source configuration. By forming the memory strings this way, a density of the memory strings of the 3D memory device can be significantly increased. Accordingly, various merits (e.g., an amount of storable data) of the 3D memory device can be improved accordingly.

Figure 2:
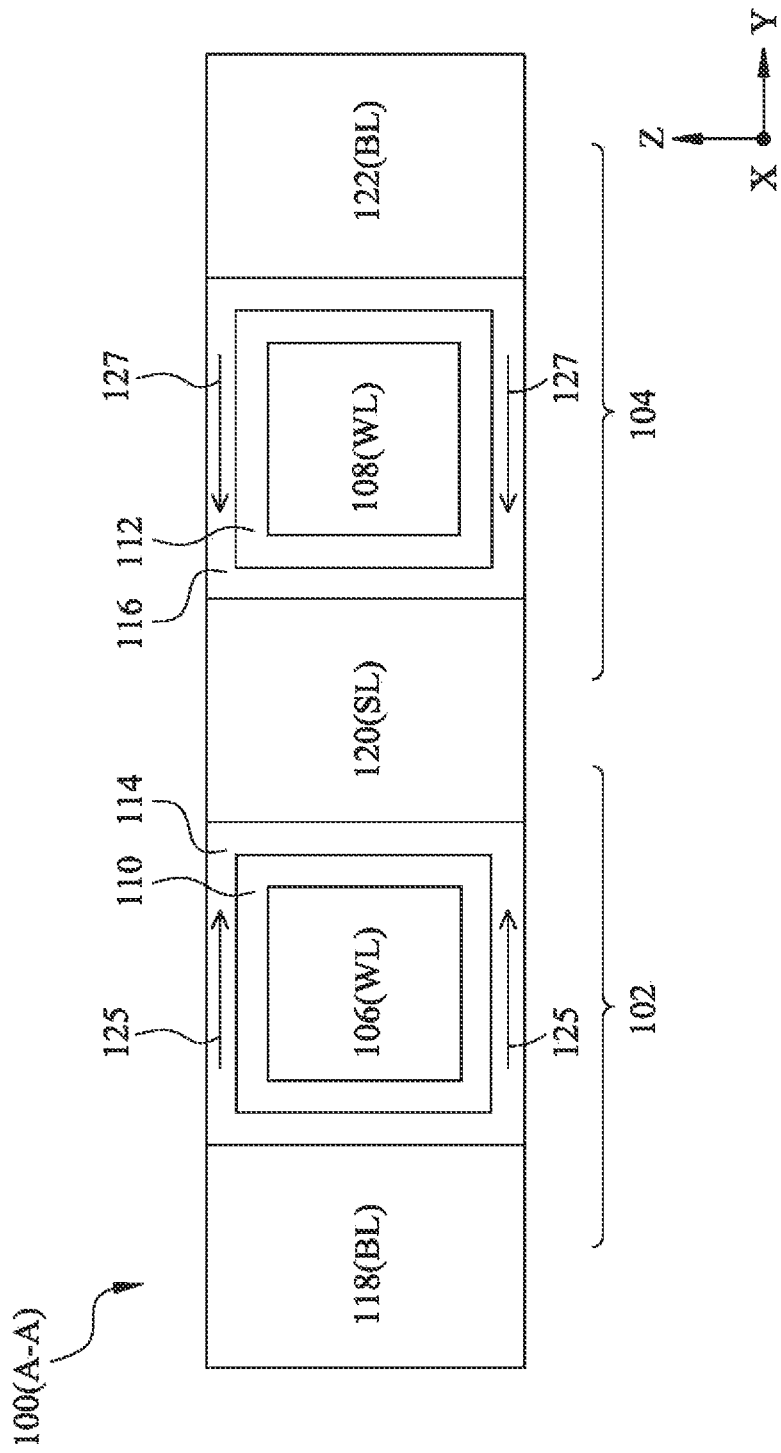
FIG. 2 illustrates a cross-sectional view of the 3D memory device of FIG. 1, in accordance with some embodiments.
Figure 3:
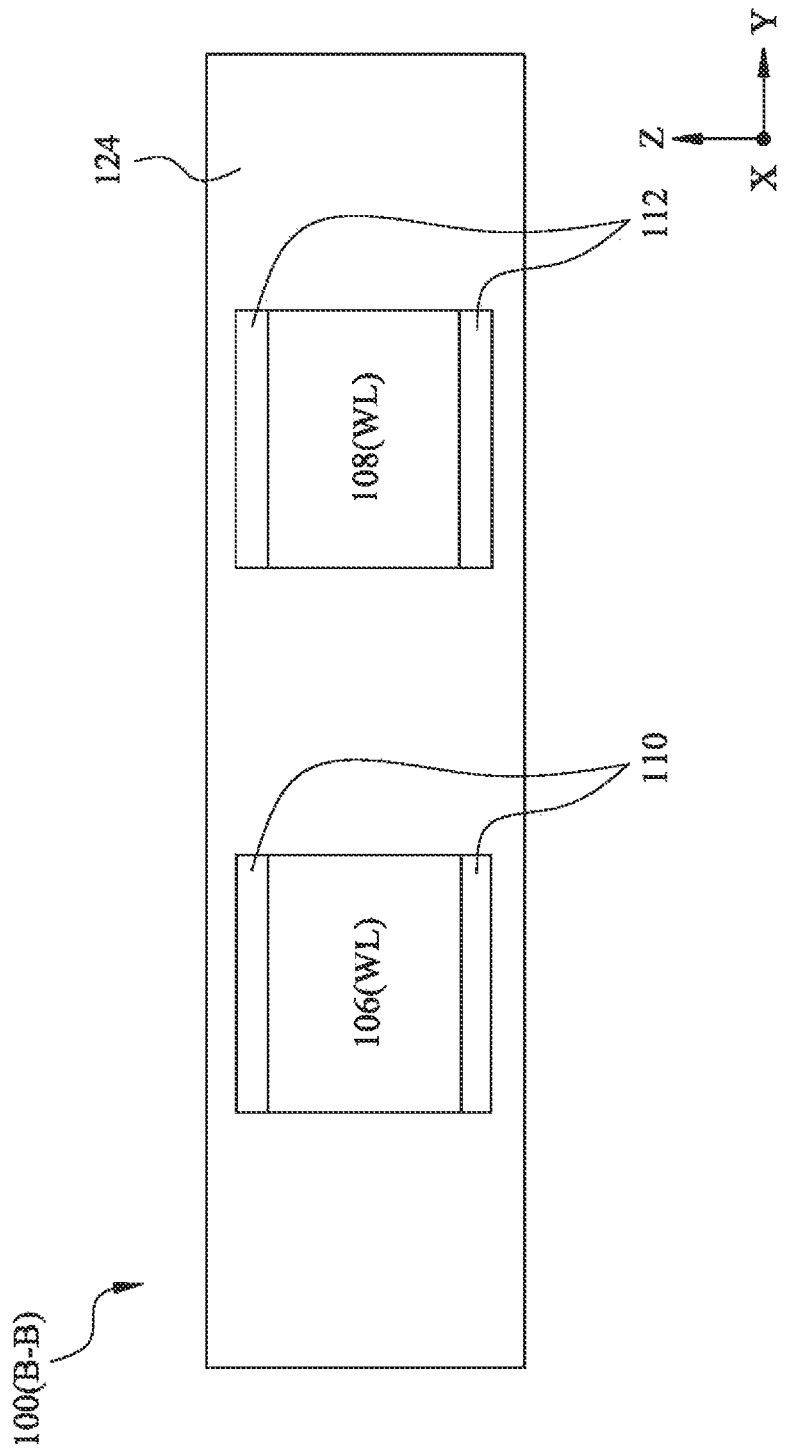
FIG. 3 illustrates another cross-sectional view of the 3D memory device of FIG. 1, in accordance with some embodiments.

FIG. 1 illustrates a perspective view of a portion of an example memory device 100, as disclosed herein, in accordance with various embodiments of the present disclosure. In addition, cross-sectional views of the memory device 100 that are cut along line A-A and B-B are illustrated in FIGS. 2 and 3, respectively. As shown, the memory device 100 includes memory cells 102 and 104 laterally disposed with each other in one of a number of memory levels vertically stacked on top of one another. Such vertically stacked memory cells (or levels) will be illustrated and discussed below. Although two memory cells are shown in one memory level, it should be appreciated that the disclosed memory device can include any number of memory cells in one memory level (which will be shown below), while remaining within the scope of the present disclosure.

In accordance with various embodiments, each of the memory cells 102 and 104 includes a first conductor structure extending along a lateral direction (e.g., the X direction), a memory film wrapping around the first conductor structure, a semiconductor film further wrapping around a portion of the memory film, a second conductor structure extending along a vertical direction (e.g., the Z direction), and a third conductor structure extending along the vertical direction (e.g., the Z direction). Specifically, neighboring memory cells (e.g., 102 and 104 as shown) share a same third conductor structure. The first conductor structure, which is sometimes referred to as a word line (WL), may function as a gate (terminal) of the corresponding memory cell; the semiconductor film may function as a channel of the corresponding memory cell; the memory film may function as a gate dielectric of the corresponding memory cell; the second conductor structure, which is sometimes referred to as a bit line (BL), may function as a drain (terminal) of the corresponding memory cell; and the shared third conductor structure, which is sometimes referred to as a source line (SL), may function as a source (terminal) of the corresponding memory cell. With the source terminals "shared" by two neighboring memory cells, a memory device configured as such may sometimes be referred to as a common-source memory device.

For example in FIGS. 1 and 2, the memory cell 102 includes a laterally extending first conductor structure 106 (hereinafter "WL 106"), a memory film 110 wrapping around the WL 106, a semiconductor film 114 wrapping around a portion of the memory film 110, a vertically extending second conductor structure 118 (hereinafter "BL 118"), and a vertically extending third conductor structure 120 (hereinafter "SL 120"). Similarly, the memory cell 104 includes a laterally extending first conductor structure 108 (hereinafter "WL 108"), a memory film 112 wrapping around the WL 108, a semiconductor film 116 wrapping around a portion of the memory film 112, and a vertically extending second conductor structure 122 (hereinafter "BL 122"), and shares the SL 120 with the memory cell 102.

Further, the memory device 100 includes an insulating layer having multiple portions configured to disposed between neighboring semiconductor films and/or conductor structures, so as to electrically isolate them from each other. For example in FIGS. 1 and 3, the WL 106 and WL 108 (i.e., the gate terminals of the memory cells 102 and 104, respectively) are isolated from each other by an insulating layer 124. Still further, it should be noted that the semiconductor film (e.g., 114, 116) may wrap around a portion of the corresponding WL with other portions wrapped by the insulating layer 124, in accordance with some embodiments. For example, the semiconductor film 114 wraps around a portion of the WL 106 (as shown in FIG. 2), while other portions of the WL 106 are wrapped by the insulating layer 124; and the semiconductor film 116 wraps a portion of the WL 108, while other portions of the WL 108 are wrapped by the insulating layer 124 (as shown in FIGS. 1 and 3).

As will be illustrated below, neighboring memory levels are also (e.g., electrically) isolated from each other with the insulating layer 124. For example, while a memory string, including a number of memory cells respectively arranged across multiple memory levels, may share the same BL and SL, these memory cells may have their own WLs wrapped by their respective semiconductor films. These WLs and semiconductor films (across multiple memory levels) are isolated from each other by the insulating layer 124. With such a configuration, the memory cells of a memory string may be individually selected, while other unselected memory cells may remain turned off (or deactivated).

For example, when the memory cell 102, which belongs to a certain memory string, is selected to be programmed or read, the WL 106 is asserted (e.g., by being applied with a logically high voltage) and the WLs in other memory levels (not shown in FIGS. 1-3) remain unasserted (e.g., by being applied with a logically low voltage). As such, electricity can be conducted along the semiconductor film 114 to flow current 125 from the BL 118 to SL 120. Since the semiconductor film (channel) 114 is isolated from the semiconductor films in other levels, even if there is any electricity conducted in those channels (which may constitute leakage current for the selected memory cell 102), an amount of such leakage current may be significantly low. Further, as the channel 114 is formed (or otherwise confined) around the WL 106, without any portion extending to be coupled to other WL, the majority amount of electrical fields induced by the WL 106 can be confined within the channel 114, which can advantageously increase gate controllability of the selected memory cell.

In addition, by coupling the BL 118 and 120 on opposite sides of the WL 106 (e.g., along the Y direction), at least two portions of the channel 114 can conduct electricity thereby flowing current (e.g., 125). For example in FIG. 2, two portions of the channel 114 disposed above and below the WL 106, respectively, can flow current 125, which can advantageously increase reading current of the memory cell 102. Similarly, upon being activated (e.g., by asserting the WL 108), multiple portions of the semiconductor film (channel) 116 can flow current 127.

In accordance with various embodiments, with a common SL (e.g., 120) shared by two neighboring memory cells (e.g., 102 and 104) in a memory device, the memory device may be efficiently operated based on the following principle. For example, when the memory cell 102 is selected, the memory cell 104 may remain unselected, through which the WL 106 is asserted (e.g., applied with a logic high signal) and the WL 108 is deasserted (e.g., applied with a logic low signal). Further, the BL 118 is applied with a logic high signal and the BL 122 is applied with a logic low signal, while the common SL 120 is tied to a logic low signal. As such, electricity can be conducted in the channel 114 and current 125 can flow through the channel 114. Similarly, when the memory cell 104 is selected, the memory cell 102 may remain unselected, through which the WL 108 is asserted (e.g., applied with a logic high signal) and the WL 106 is deasserted (e.g., applied with a logic low signal). Further, the BL 122 is applied with a logic high signal and the BL 1118 is applied with a logic low signal, while the common SL 120 is tied to a logic low signal. As such, electricity can be conducted in the channel 116 and current 127 can flow through the channel 116.

Figure 4:
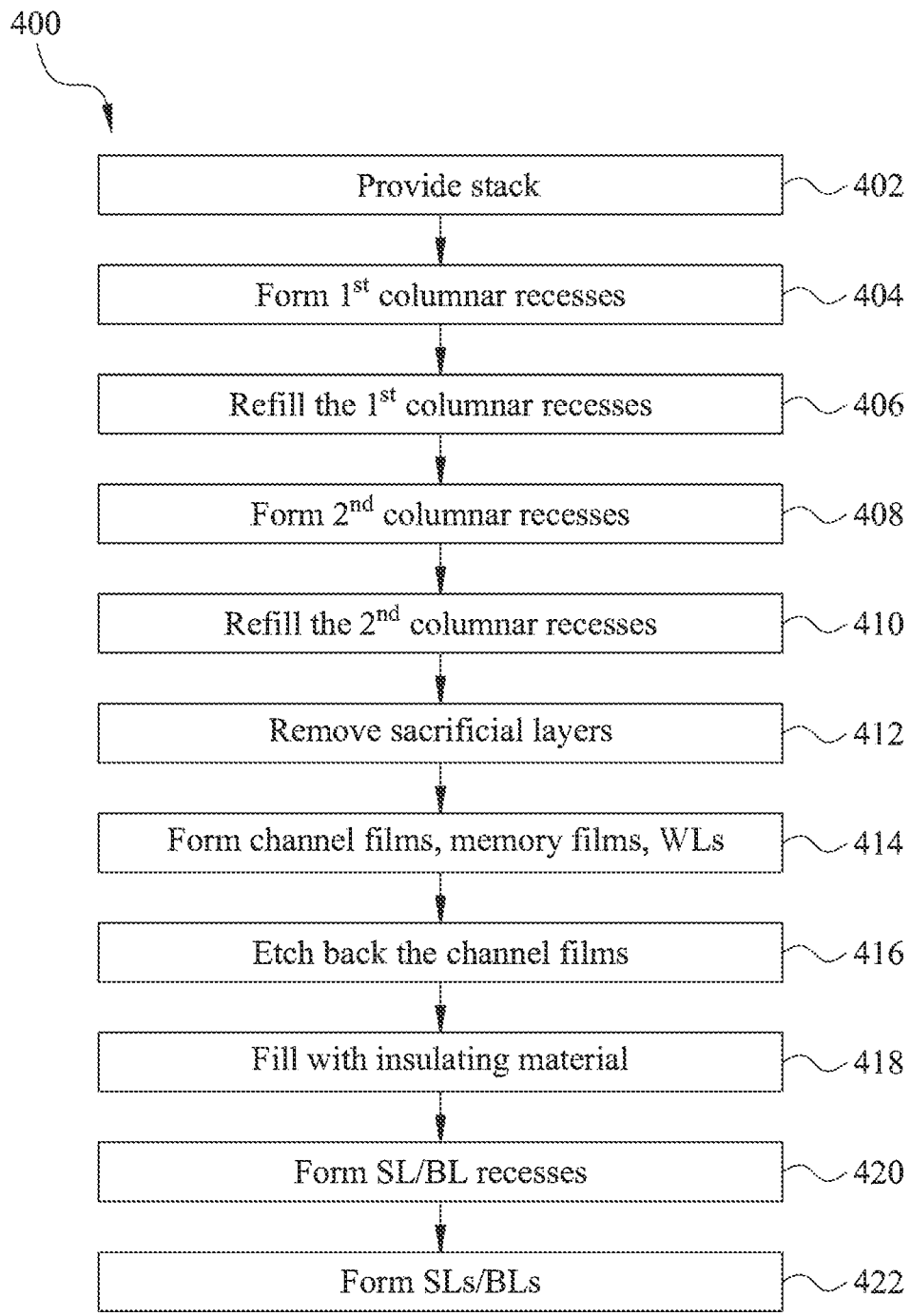
FIG. 4 is an example flow chart of a method for forming a 3D memory device, in accordance with some embodiments.

FIG. 4 illustrates a flowchart of a method 400 to form a memory device, according to one or more embodiments of the present disclosure. For example, at least some of the operations (or steps) of the method 400 can be used to form a three-dimensional (3D) memory device having a number of memory cells (e.g., 102 and 104 of FIGS. 1-3) laterally separated from each other. A number of each of the memory cells, vertically spaced from one another, can form a memory string, and a number of the memory strings, laterally spaced from one another, can form a 3D memory array.

It is noted that the method 400 is merely an example, and is not intended to limit the present disclosure. Accordingly, it should be understood that additional operations may be provided before, during, and after the method 400 of FIG. 4, and that some other operations may only be briefly described herein. In some embodiments, operations of the method 400 may be associated with perspective views of an example 3D memory device at various fabrication stages as shown in FIGS. 5, 6, 7, 8, 9, 10, 11, 12, 13, 14, 15, 16, 17, 18, 19, 20, 21, 22, 23, 24, 25, and 26, respectively, which will be discussed in further detail below.

In brief overview, the method 400 starts with operation 402 of providing a stack of insulating layers and sacrificial layers over a substrate. The method 400 continues to operation 404 of forming a number of first columnar recesses. The method 400 continues to operation 406 of refilling the first columnar recesses. The method 400 continues to operation 408 of forming a number of second columnar recesses. The method 400 continues to operation 410 of refilling the second columnar recesses. The method 400 continues to operation 412 of removing sacrificial layers. The method 400 continues to operation 414 of forming semiconductor films, memory films, and WLs. The method 400 continues to operation 416 of etching back the semiconductor films. The method 400 continues to operation 418 of filling with an insulating material. The method 400 continues to operation 420 of forming SL recesses and BL recesses. The method 400 continues to operation 422 of forming SLs and BLs.

Figure 5:
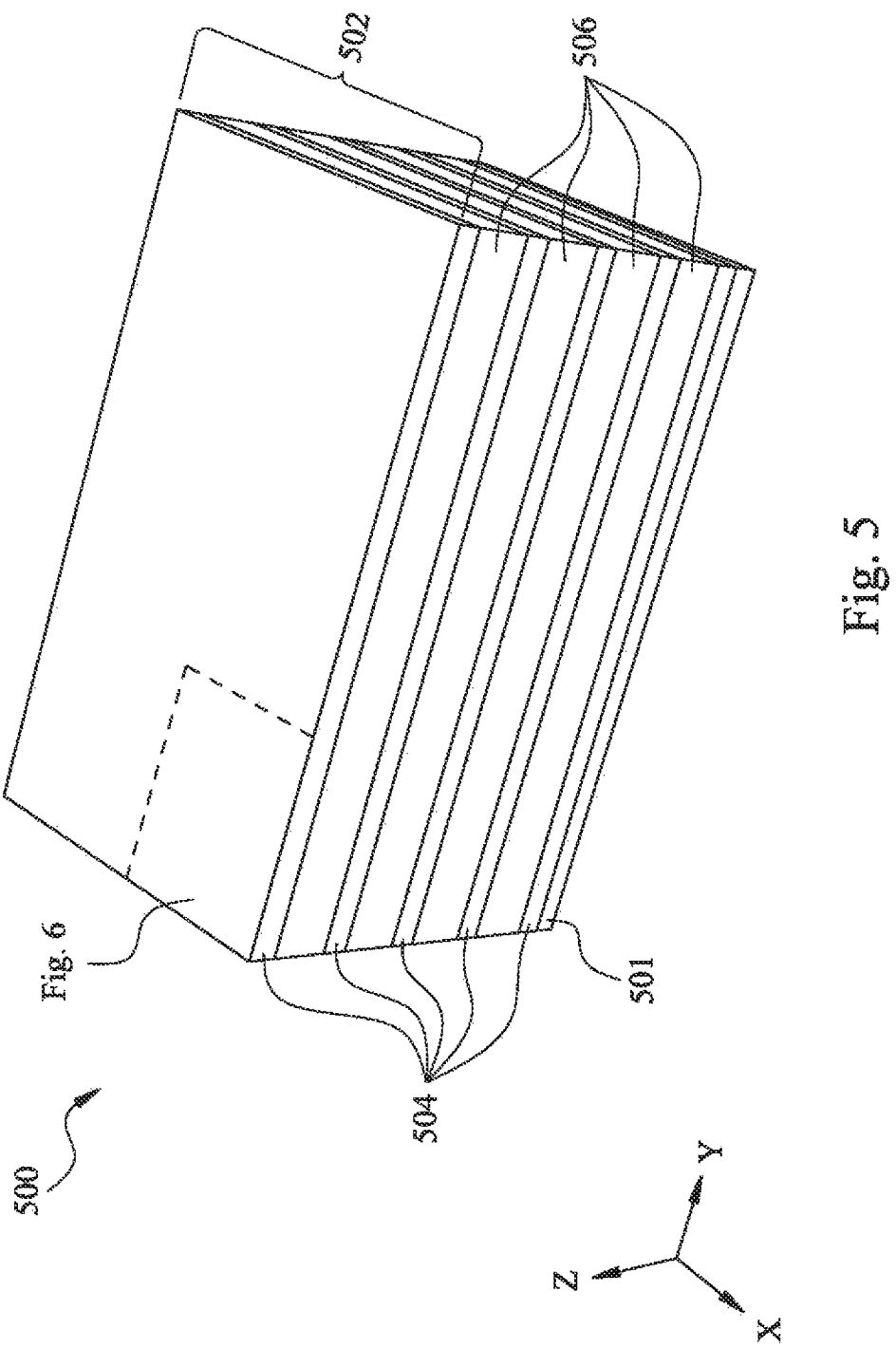
FIGS. 5, 6, 7, 8, 9, 10, 11, 12, 13, 14, 15, 16, 17, 18, 19, 20, 21, 22, 23, 24, 25, and 26 illustrate perspective views of an example 3D memory device (or a portion of the example 3D memory device) during various fabrication stages, made by the method of FIG. 4, in accordance with some embodiments.
Figure 6:
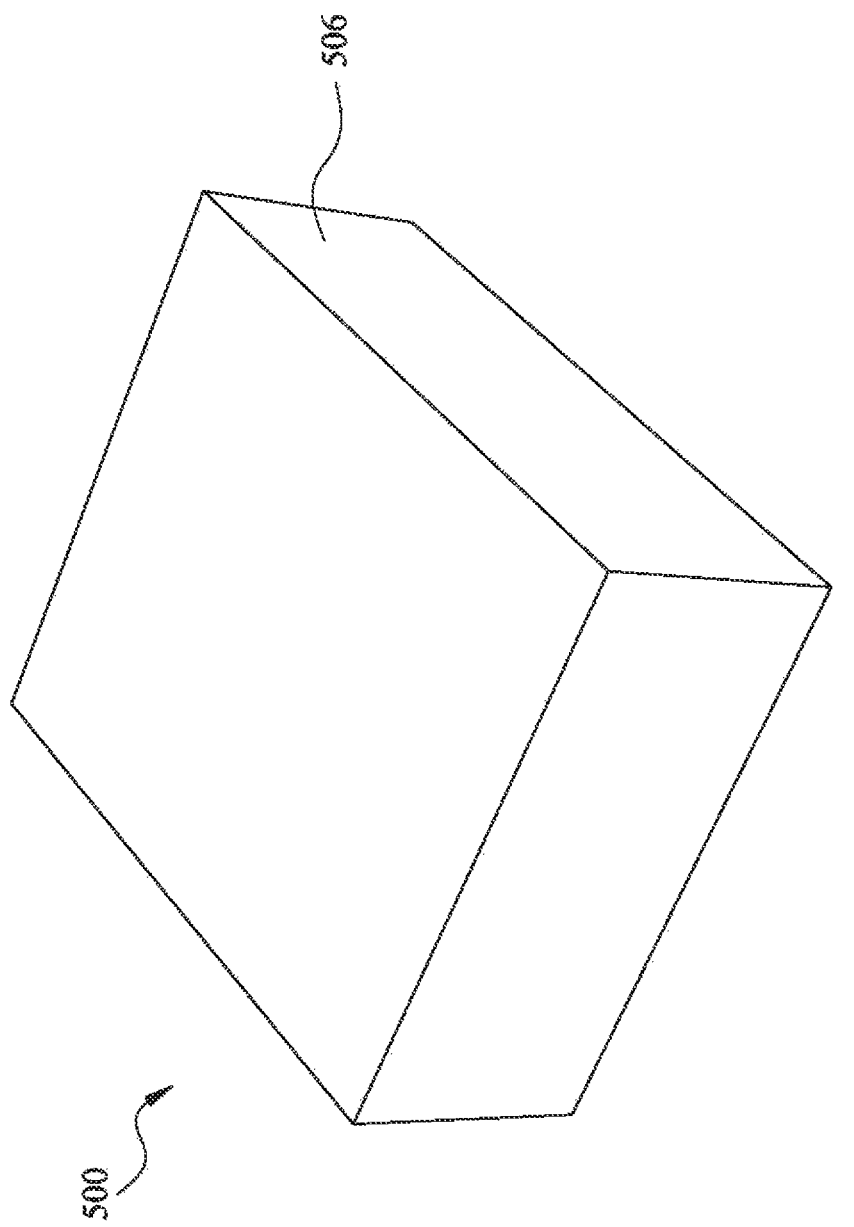

Corresponding to operation 402 of FIG. 4, FIG. 5 illustrates a perspective view of the 3D memory device 500 including a stack 502 formed over a substrate 501 at one of the various stages of fabrication, in accordance with various embodiments. FIG. 6 illustrates an enlarged view of a portion of the 3D memory device 500. For example, the portion illustrated in FIG. 6 may correspond to the footprint of one memory cell (or one memory string) of the 3D memory device 500.

The substrate 501 may be a semiconductor substrate, such as a bulk semiconductor, a semiconductor-on-insulator (SOI) substrate, or the like, which may be doped (e.g., with a p-type or an n-type dopant) or undoped. The substrate 501 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 501 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure. For example, the substrate 501 may include an insulating material (e.g., silicon nitride (SiN)) that function as an etch stop layer disposed over a semiconductor substrate.

The stack 502 includes a number of insulating layers 504 and a number of sacrificial layers 506 alternately stacked on top of one another over the substrate 501 along a vertical direction (e.g., the Z direction). Although five insulating layers 504 and four sacrificial layers 506 are shown in the illustrated embodiments of FIG. 5, it should be understood that the stack 502 can include any number of insulating layers and any number of sacrificial layers alternately disposed on top of one another, while remaining within the scope of the present disclosure.

Further, although the stack 502 directly contacts the substrate 501 in the illustrated embodiment of FIG. 5 (and the following figures), it should be understood that the stack 502 may be separated from a top surface of the substrate 501. For example, a number of (planar and/or non-planar) transistors may be formed over the substrate 501, and a number of metallization layers, each of which includes a number of contacts electrically connecting to those transistors, may be formed between the substrate 501 and the stack 502. As used herein, the alternately stacked insulating layers 504 and sacrificial layers 506 may refer to each of the sacrificial layers 506 being adjoined by two adjacent insulating layers 504. The insulating layers 504 may have the same thickness thereamongst, or may have different thicknesses. The sacrificial layers 506 may have the same thickness thereamongst, or may have different thicknesses. In some embodiments, the stack 502 may begin with the insulating layer 504 (as shown in FIG. 5) or the sacrificial layer 506 (in some other embodiments).

The insulating layers 504 can include at least one insulating material. The insulating materials that can be employed for the insulating layer 504 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. In one embodiment, the insulating layers 504 include silicon oxide.

The sacrificial layers 506 may include an insulating material, a semiconductor material, or a conductive material. The material of the sacrificial layers 506 is a sacrificial material that can be subsequently removed selective to the material of the insulating layers 504. In accordance with various embodiments, each sacrificial layer 506, sandwiched by a respective pair of insulating layers 504, may correspond to a memory level, in which a number of memory cells that are laterally disposed from one another can be formed. Non-limiting examples of the sacrificial layers 506 include silicon nitride, an amorphous semiconductor material (such as amorphous silicon), and a polycrystalline semiconductor material (such as polysilicon). In one embodiment, the sacrificial layers 506 can be spacer material layers that include silicon nitride or a semiconductor material including at least one of silicon or germanium. Other materials are within the scope of the present disclosure.

The stack 502 can be formed by alternately depositing the respective materials of the insulating layers 504 and sacrificial layers 506 over the substrate 501. In some embodiments, one of the insulating layers 504 can be deposited, for example, by chemical vapor deposition (CVD), followed by depositing such as, for example, using CVD or atomic layer deposition (ALD), one of the sacrificial layers 506. Other methods of forming the stack 502 are within the scope of the present disclosure.

Figure 7:
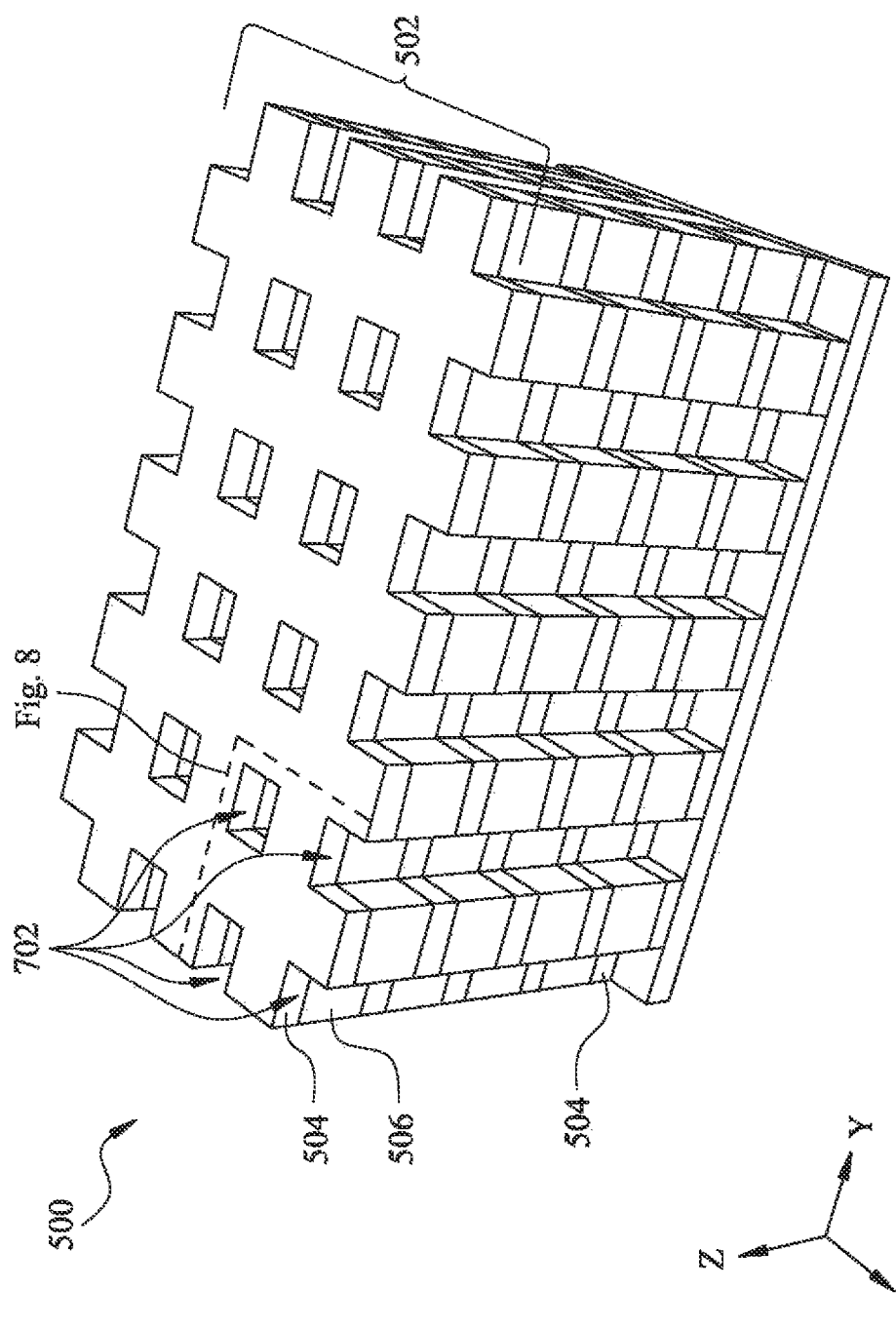
Figure 8:
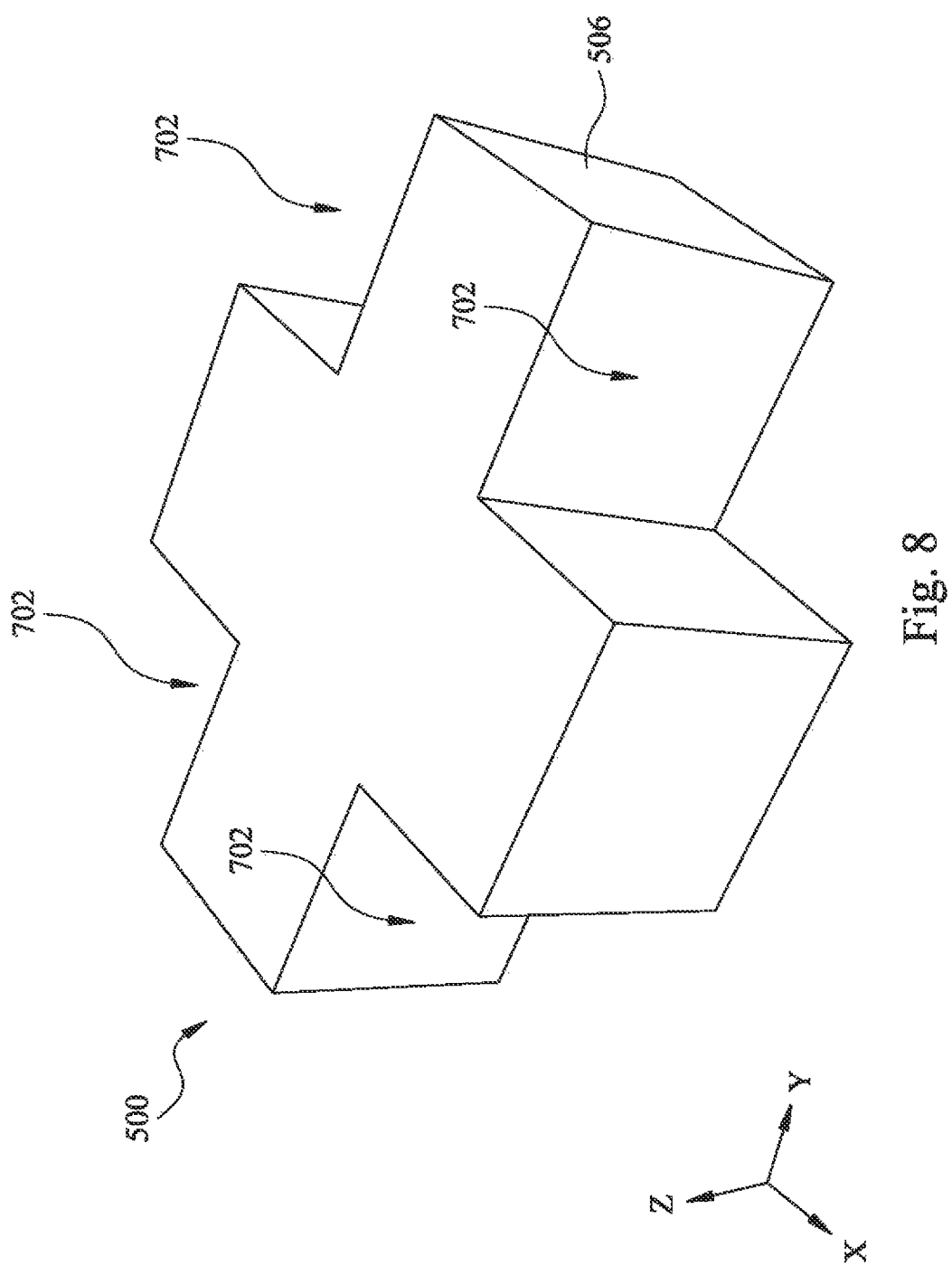

Corresponding to operation 404 of FIG. 4, FIG. 7 illustrates a perspective view of the 3D memory device 300 in which a number of first columnar recesses 702 are formed at one of the various stages of fabrication, in accordance with various embodiments. FIG. 8 illustrates an enlarged view of a portion of the 3D memory device 500. For example, the portion illustrated in FIG. 8 may correspond to the footprint of one memory cell (or one memory string) of the 3D memory device 500.

Laterally (e.g., along the X direction or Y direction), the first columnar recesses 702 are separated from one another. For example, none of the first columnar recesses 702 merges or otherwise contacts with another one of the first columnar recesses 702, when viewed from the top. Vertically (e.g., along the Z direction), each of the first columnar recesses 702 penetrates through the stack 502. For example, the first columnar recesses 702 may each penetrate through stack 502 (e.g., from the bottommost insulating layers 504 to the topmost insulating layers 504), as shown in FIG. 7. In some other embodiments, the first columnar recesses 702 may partially extend through the stack 502.

According to various embodiments of the present disclosure, the first columnar recesses 702 may be firstly refilled with a first insulating material (similar to the material of sacrificial layers 506), removed, and secondly refilled with a second insulating material (similar to the material of insulating layers 504), all of which will be discussed below. Upon being refilled with the second insulating material, dielectric columnar structures that fill up the first columnar recesses 702 can each isolate neighboring memory strings disposed along the Y direction.

Figure 9:
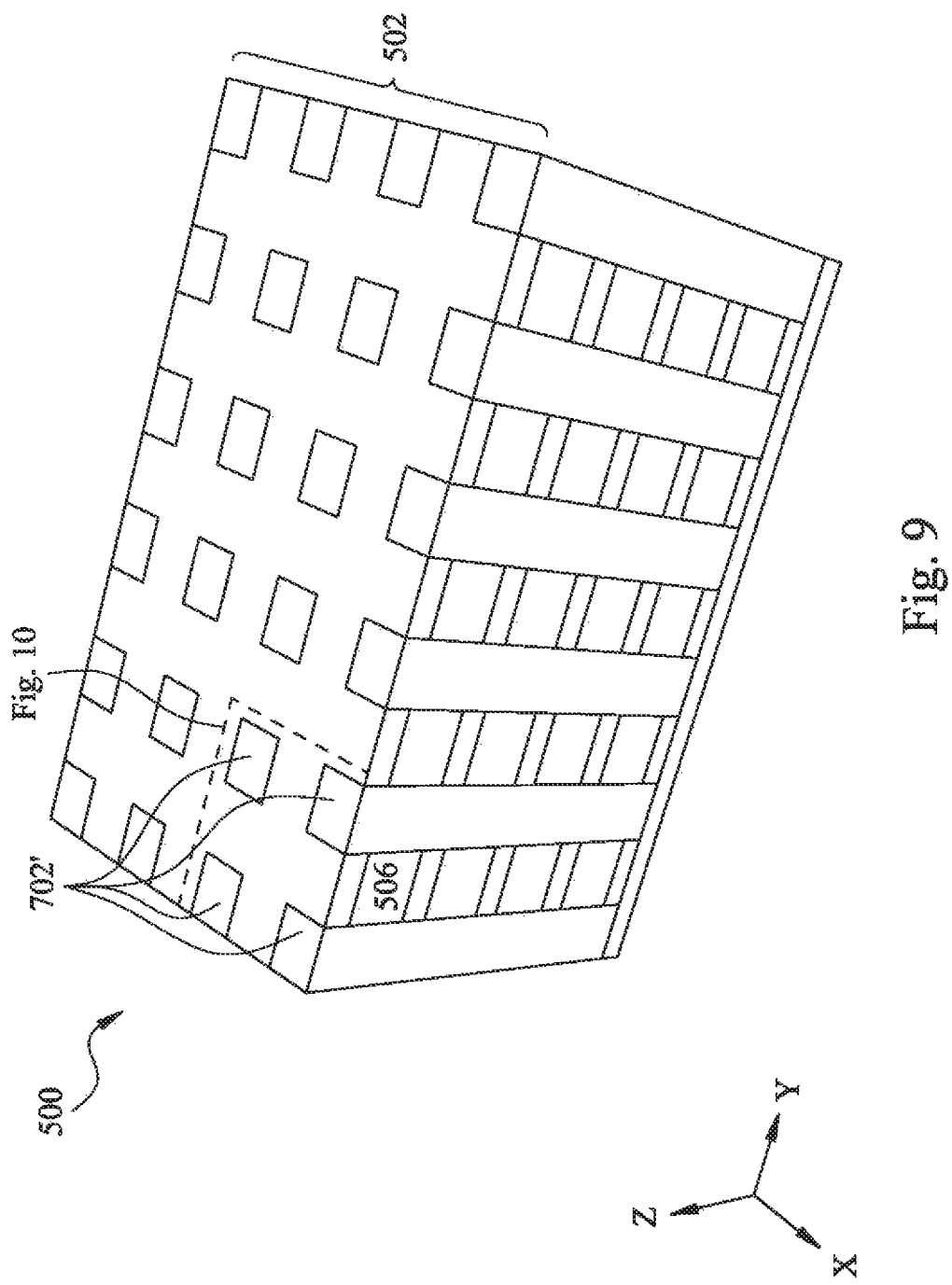
Figure 10:
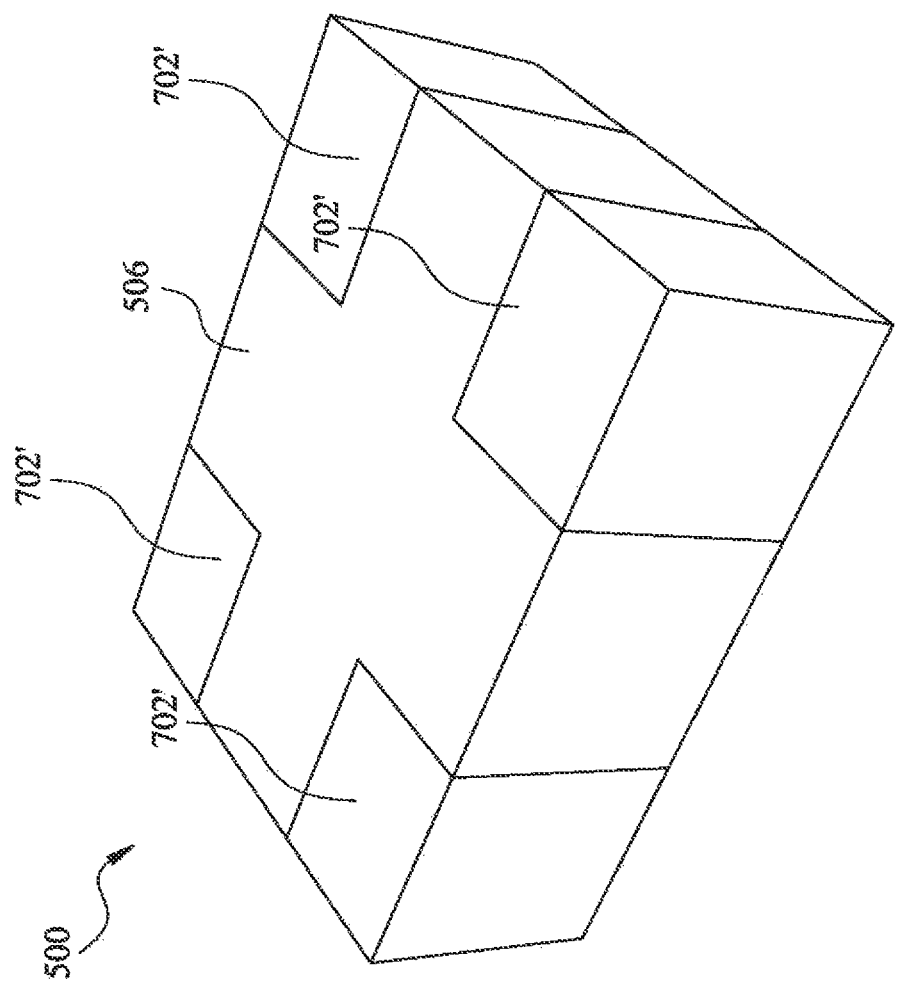

Corresponding to operation 406 of FIG. 4, FIG. 9 illustrates a perspective view of the 3D memory device 500 in which the first columnar recesses 702 are refilled at one of the various stages of fabrication, in accordance with various embodiments. FIG. 10 illustrates an enlarged view of a portion of the 3D memory device 500. For example, the portion illustrated in FIG. 10 may correspond to the footprint of one memory cell (or one memory string) of the 3D memory device 500.

As shown, the first columnar recesses 702 are refilled with a first insulating material (e.g., the same material as the sacrificial layers 506), followed by a chemical mechanical polishing (CMP) process. Consequently, a number of interim dielectric columnar structures 702', inheriting the profiles and dimensions of the first columnar recesses 702, are formed. The first columnar recesses 702 can be refilled with the foregoing first insulating material, for example, by a conformal deposition method such as atomic layer deposition (ALD) or chemical vapor deposition (CVD). Other deposition methods are within the scope of the present disclosure.

Figure 11:
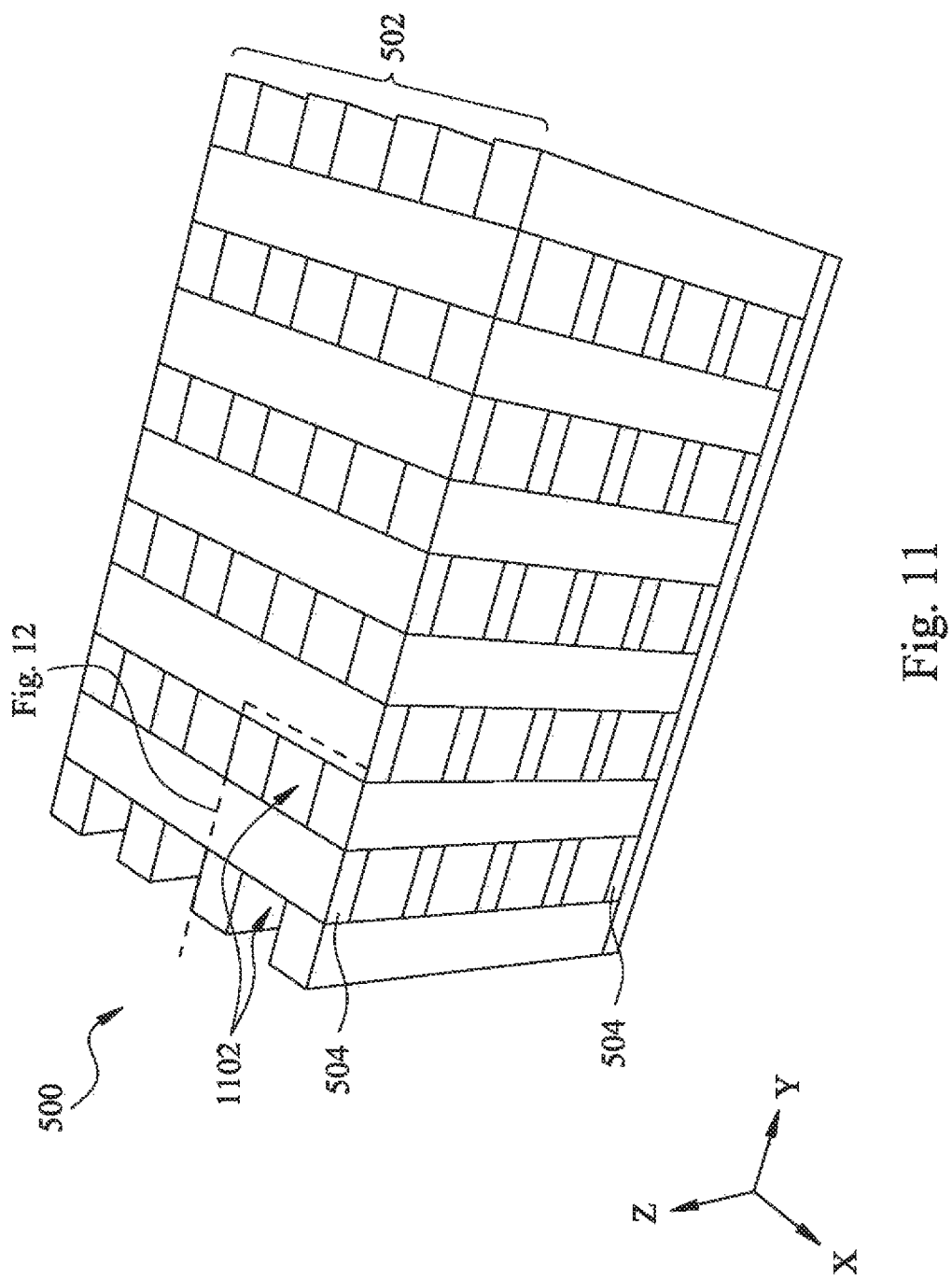
Figure 12:
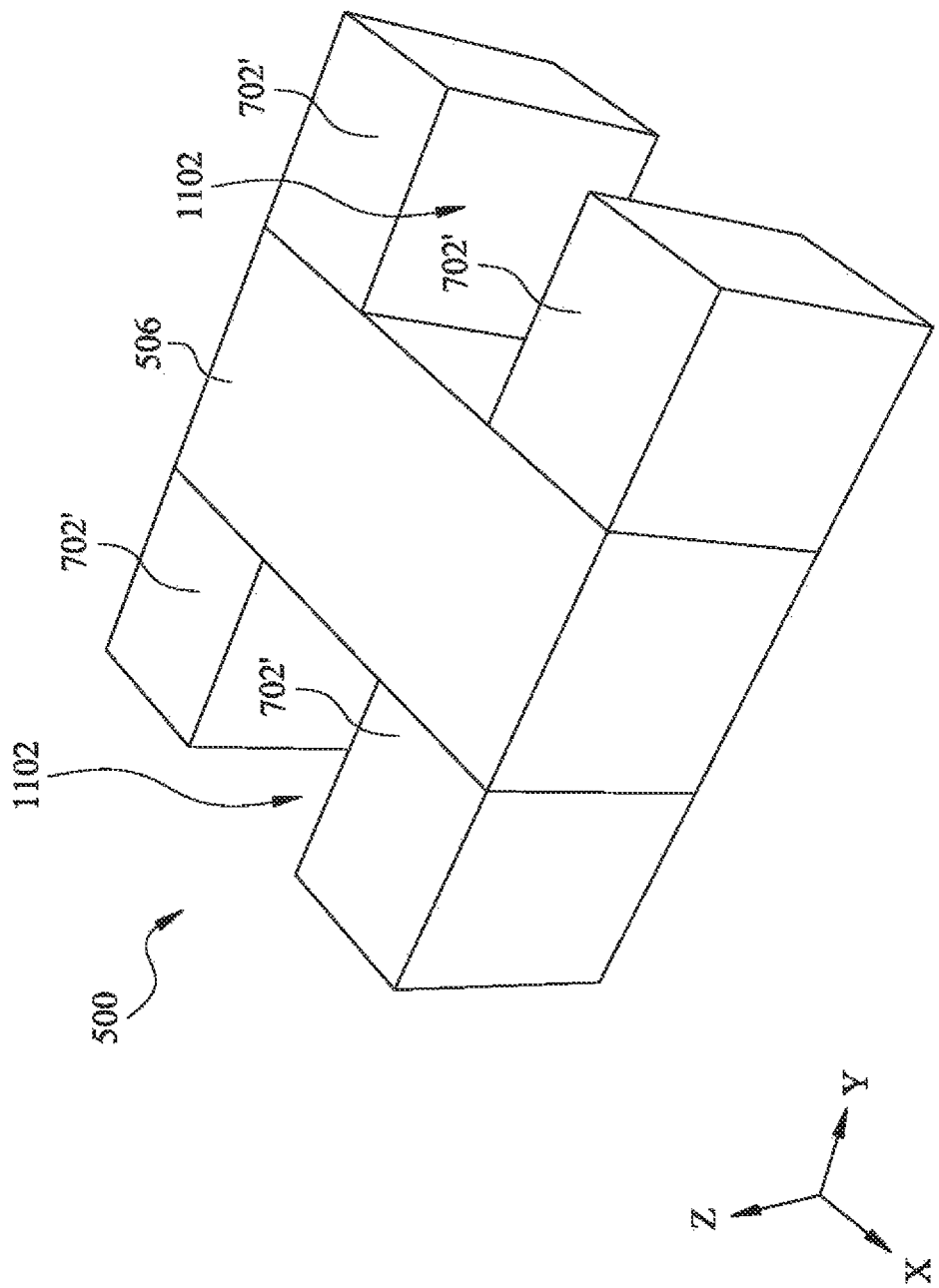

Corresponding to operation 408 of FIG. 4, FIG. 11 illustrates a perspective view of the 3D memory device 300 in which a number of second columnar recesses 1102 are formed at one of the various stages of fabrication, in accordance with various embodiments. FIG. 12 illustrates an enlarged view of a portion of the 3D memory device 500. For example, the portion illustrated in FIG. 12 may correspond to the footprint of one memory cell (or one memory string) of the 3D memory device 500.

Laterally (e.g., along the X direction or Y direction), the second columnar recesses 1102 are separated from one another. For example, none of the second columnar recesses 1102 merges or otherwise contacts with another one of the second columnar recesses 1102, when viewed from the top. Further, each of the second columnar recesses 1102 is formed between a respective pair of the interim dielectric columnar structures 702', which can be better appreciated in FIG. 12. Vertically (e.g., along the Z direction), each of the second columnar recesses 1102 penetrates through the stack 502. For example, the second columnar recesses 1102 may each penetrate through stack 502 (e.g., from the bottommost insulating layers 504 to the topmost insulating layers 504), as shown in FIG. 11. In some other embodiments, the second columnar recesses 1102 may partially extend across the stack 502.

Figure 13:
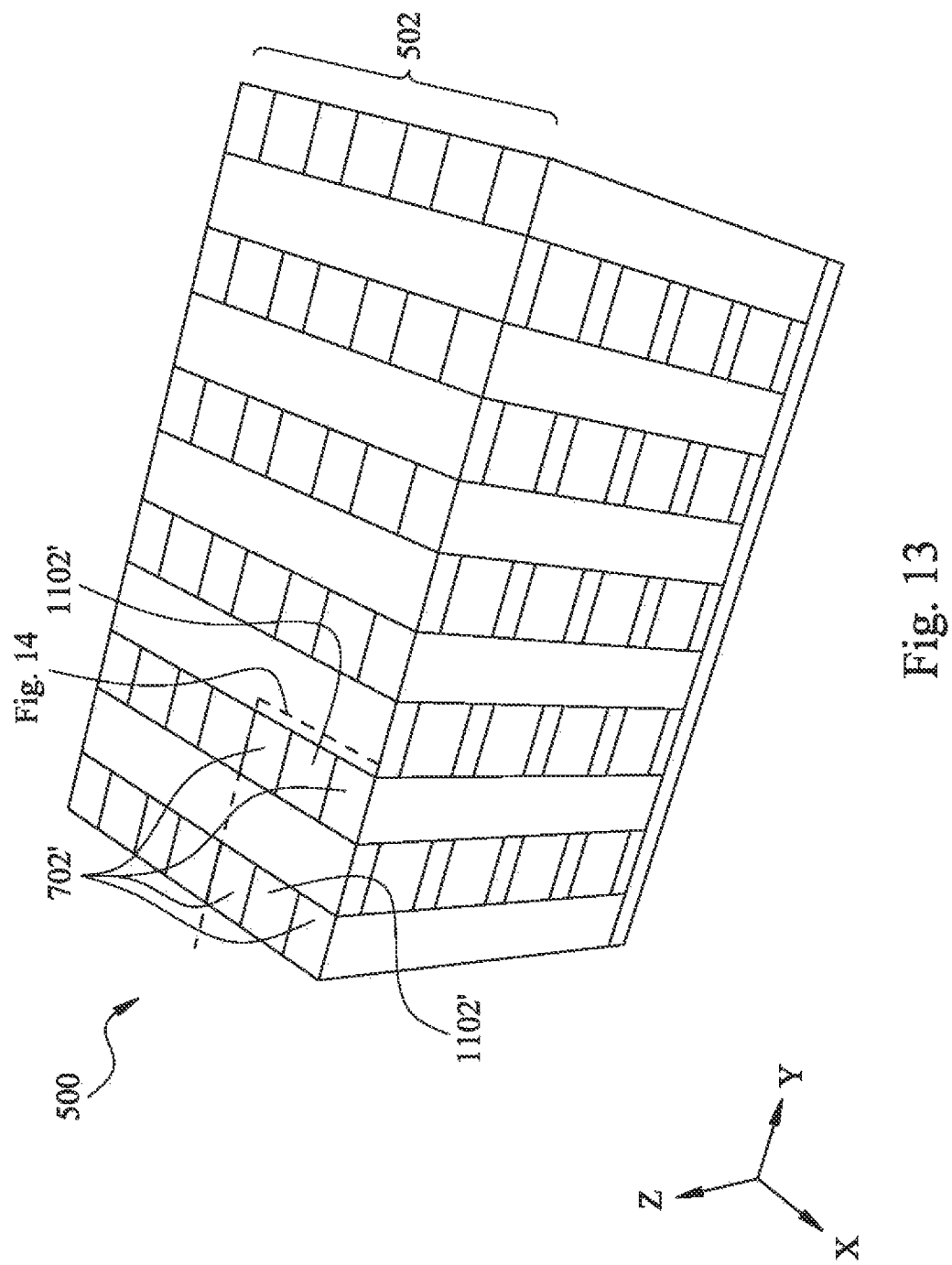
Figure 14:
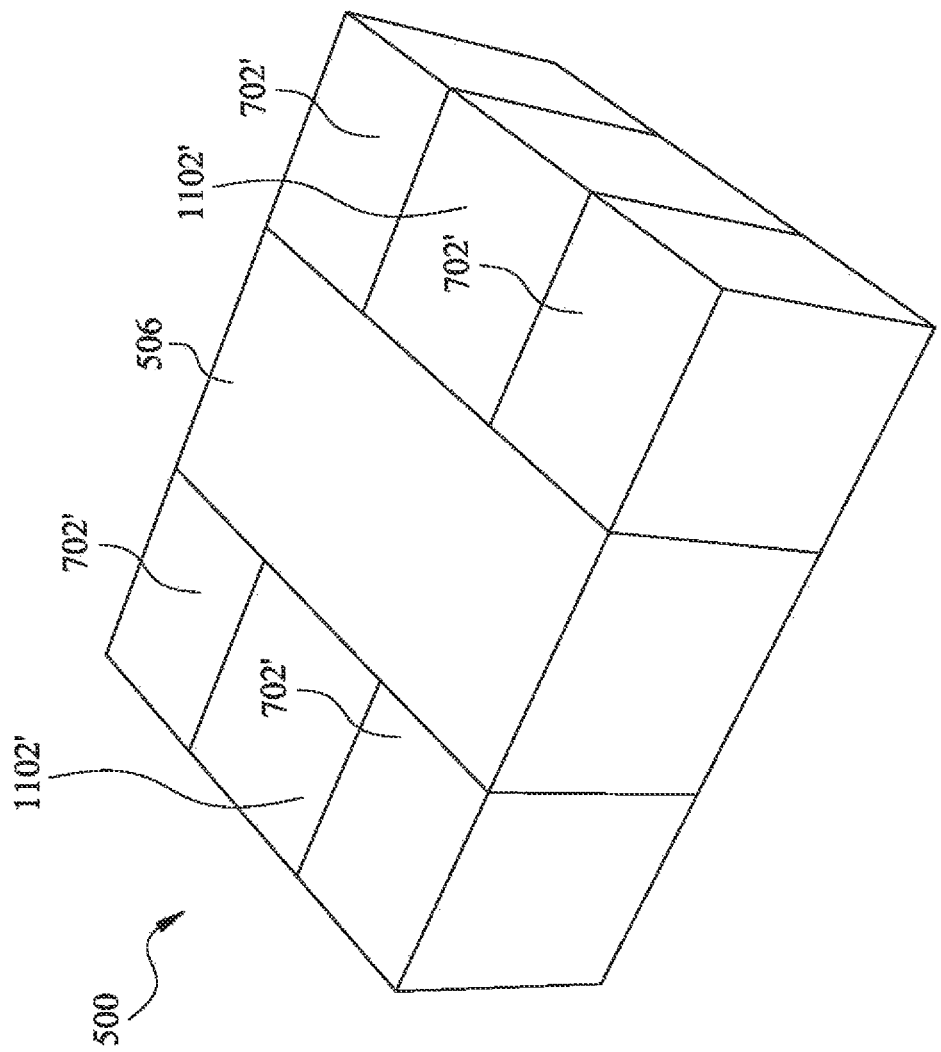

Corresponding to operation 410 of FIG. 4, FIG. 13 illustrates a perspective view of the 3D memory device 300 in which the second columnar recesses 1102 are refilled at one of the various stages of fabrication, in accordance with various embodiments. FIG. 14 illustrates an enlarged view of a portion of the 3D memory device 500. For example, the portion illustrated in FIG. 14 may correspond to the footprint of one memory cell (or one memory string) of the 3D memory device 500.

The second columnar recesses 1102 are refilled with yet another insulating material (e.g., different from any of the materials of the insulating layers 504 and sacrificial layers 506), followed by a chemical mechanical polishing (CMP) process. Consequently, a number of interim dielectric columnar structures 1102', inheriting the profiles and dimensions of the second columnar recesses 1102, are formed. That is, each of the interim dielectric columnar structures 1102' is disposed between a respective pair of the interim dielectric columnar structures 702', as better appreciated in FIG. 14. Specifically, such an insulating material that refills the second columnar recesses 1102 may be characterized with an etching selectivity with respect to the insulating layers 504 and sacrificial layers 506. As such, when etching the interim dielectric columnar structures 1102', dielectric columnar structures formed of the material of insulating layers 504 may remain intact. Similarly, when etching the sacrificial layers 506, the interim dielectric columnar structures 1102' may remain intact. The second columnar recesses 1102 can be refilled with the foregoing insulating material, for example, by a conformal deposition method such as atomic layer deposition (ALD) or chemical vapor deposition (CVD). Other deposition methods are within the scope of the present disclosure.

Figure 15:
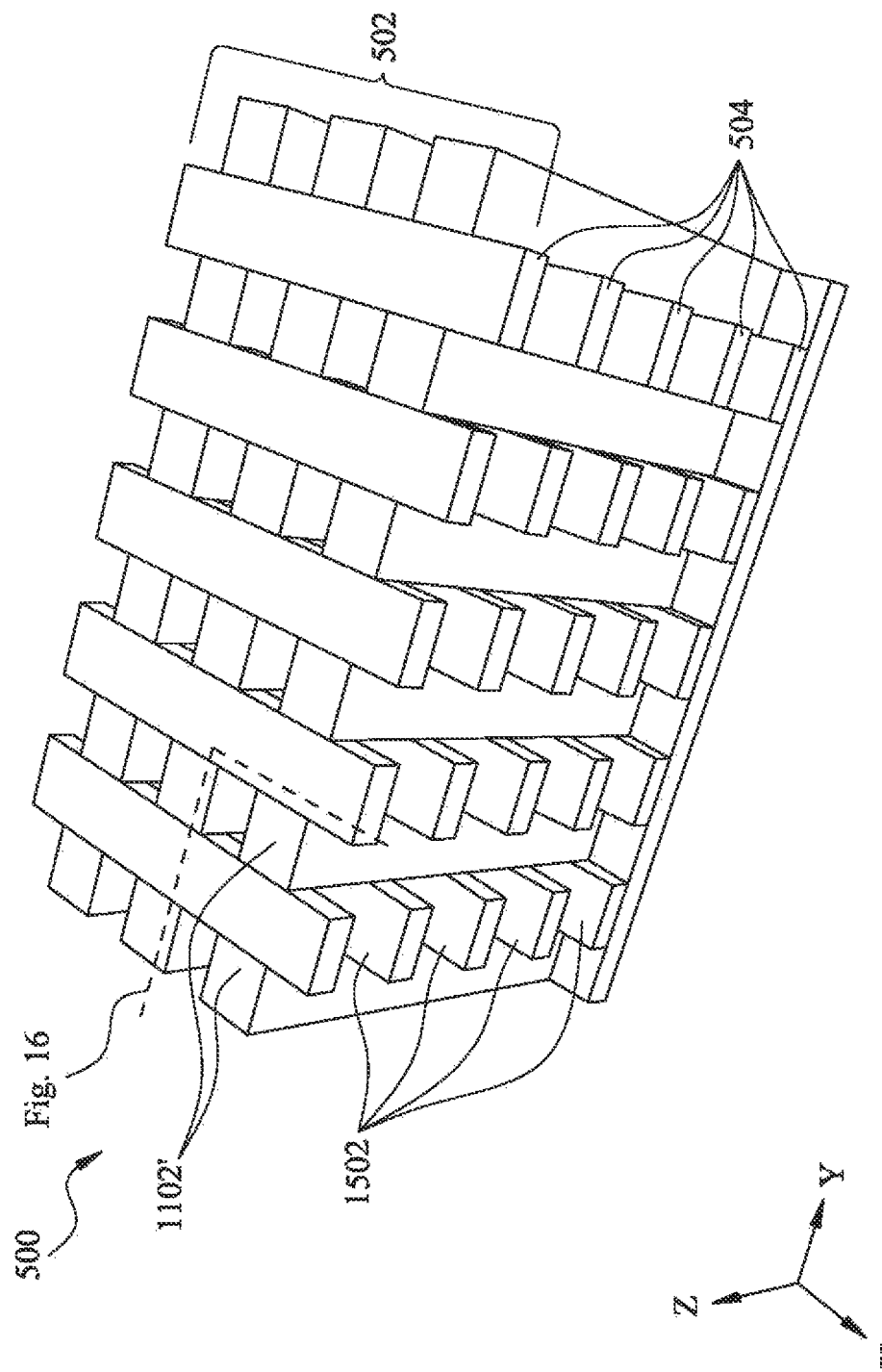

Corresponding to operation 412 of FIG. 4, FIG. 15 illustrates a perspective view of the 3D memory device 300 in which the sacrificial layers 506 (and the interim dielectric columnar structures 702' formed of the same insulating material) are removed at one of the various stages of fabrication, in accordance with various embodiments. FIG.

16 illustrates an enlarged view of a portion of the 3D memory device 500. For example, the portion illustrated in FIG. 16 may correspond to the footprint of one memory cell (or one memory string) of the 3D memory device 500.

The (remaining) sacrificial layers 506 are recessed (e.g., removed) to form a number of recesses 1502, which laterally extend along the X direction. The sacrificial layers 506 can be recessed by performing an etching process (sometimes referred to as a pull-back process) that etches the sacrificial layers 506 selective to the insulating layers 504. Alternatively stated, the insulating layers 504 may remain substantially intact throughout the etching process. In some embodiments, the recess 1502 can inherit the profiles and dimensions of a corresponding one of the remaining sacrificial layers 506. As such, a number of the recesses 1502 are vertically separated from one another with a number of the insulating layers 504, and each recess 1502, along each of its sidewalls along the X direction, is in contact with a number of the interim dielectric columnar structures 1102', as shown in FIG. 15. Since the interim dielectric columnar structures 702' are formed of the same insulating material as the sacrificial layers 506, the interim dielectric columnar structures 702' may be concurrently removed during the foregoing etching process. Consequently, the first columnar recesses 702 may again be formed, as better appreciated in FIG. 16.

Figure 16:
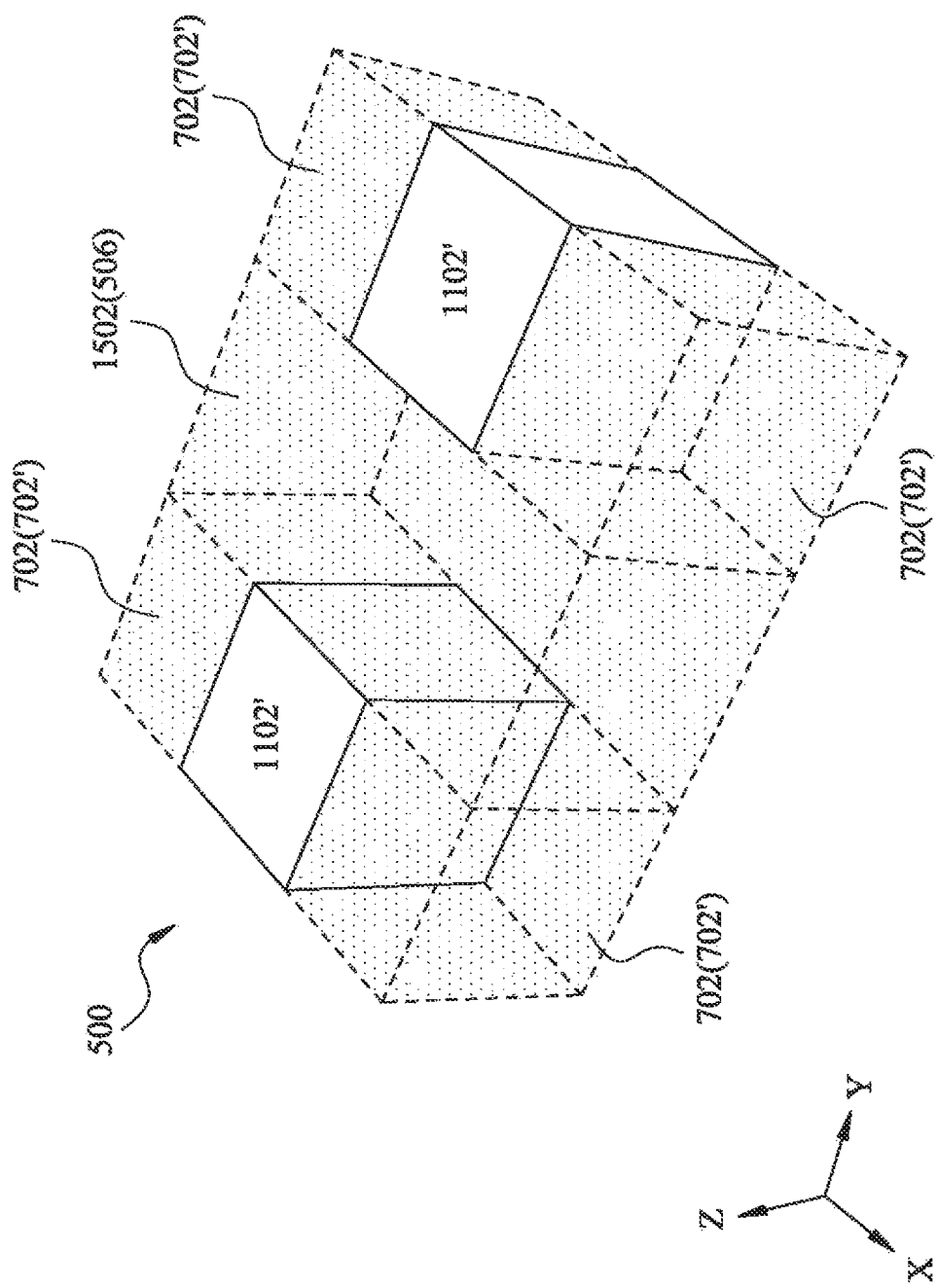

The pull-back process can include a wet etching process employing a wet etch solution, or can be a gas phase (dry) etching process in which the etchant is introduced in a vapor phase over the stack 502. In the example where the sacrificial layers 506 include silicon nitride and the insulating layers 504 include silicon oxide, the pull-back process can include a wet etching process in which the workpiece is immersed within a wet etch tank that includes phosphoric acid ($H_3PO_4$), which etches silicon nitride of the sacrificial layer 506 selective to silicon oxide and various other materials of the insulating layers 504. Other methods of etching the sacrificial layer 506 are within the scope of the present disclosure. As discussed above, since the interim dielectric columnar structures 1102' are formed of another insulating material that has an etching selectivity with respect to the sacrificial layers 506, the interim dielectric columnar structures 1102' can remain substantially intact, as shown in FIGS. 15-16.

Figure 17:
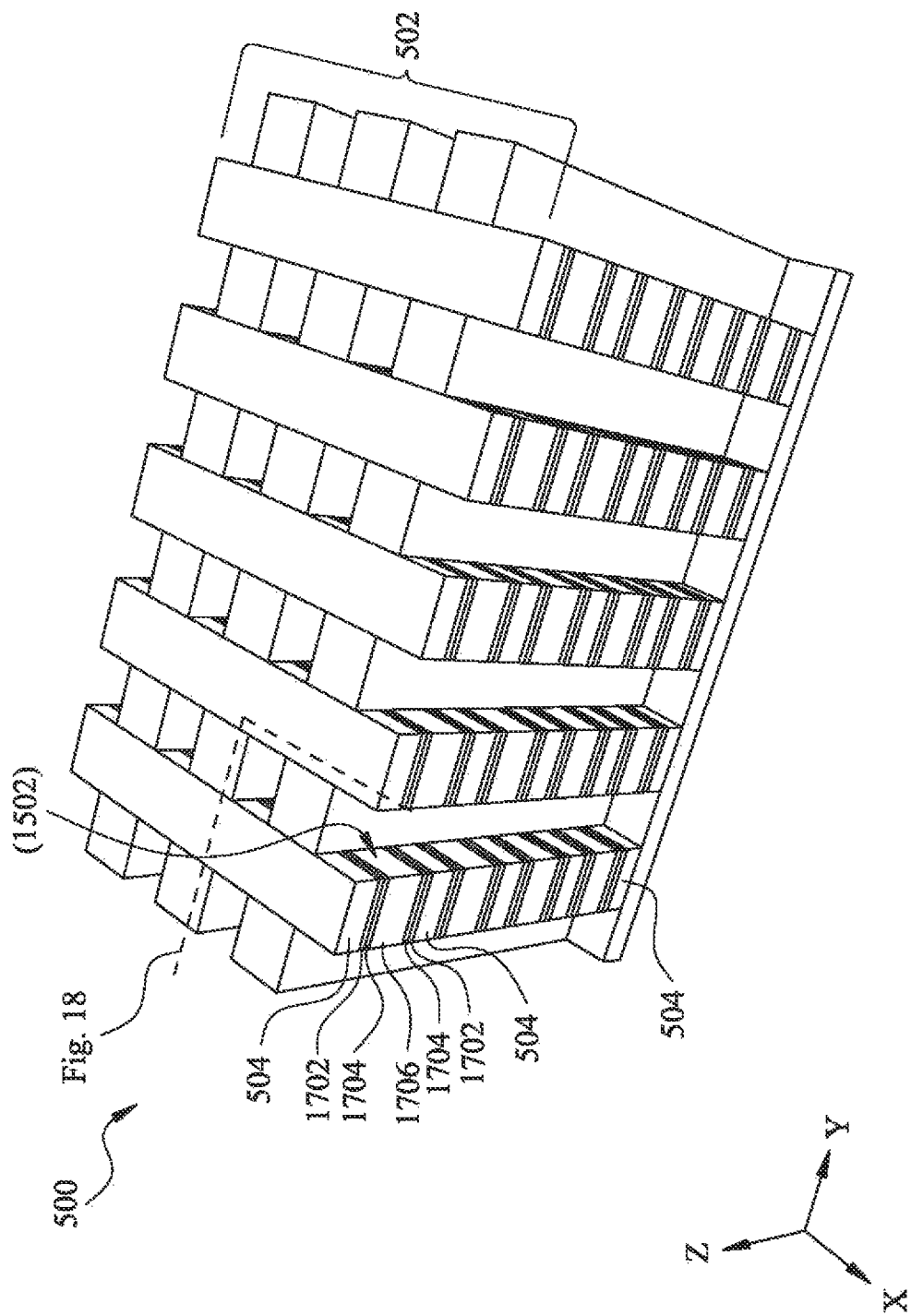
Figure 18:
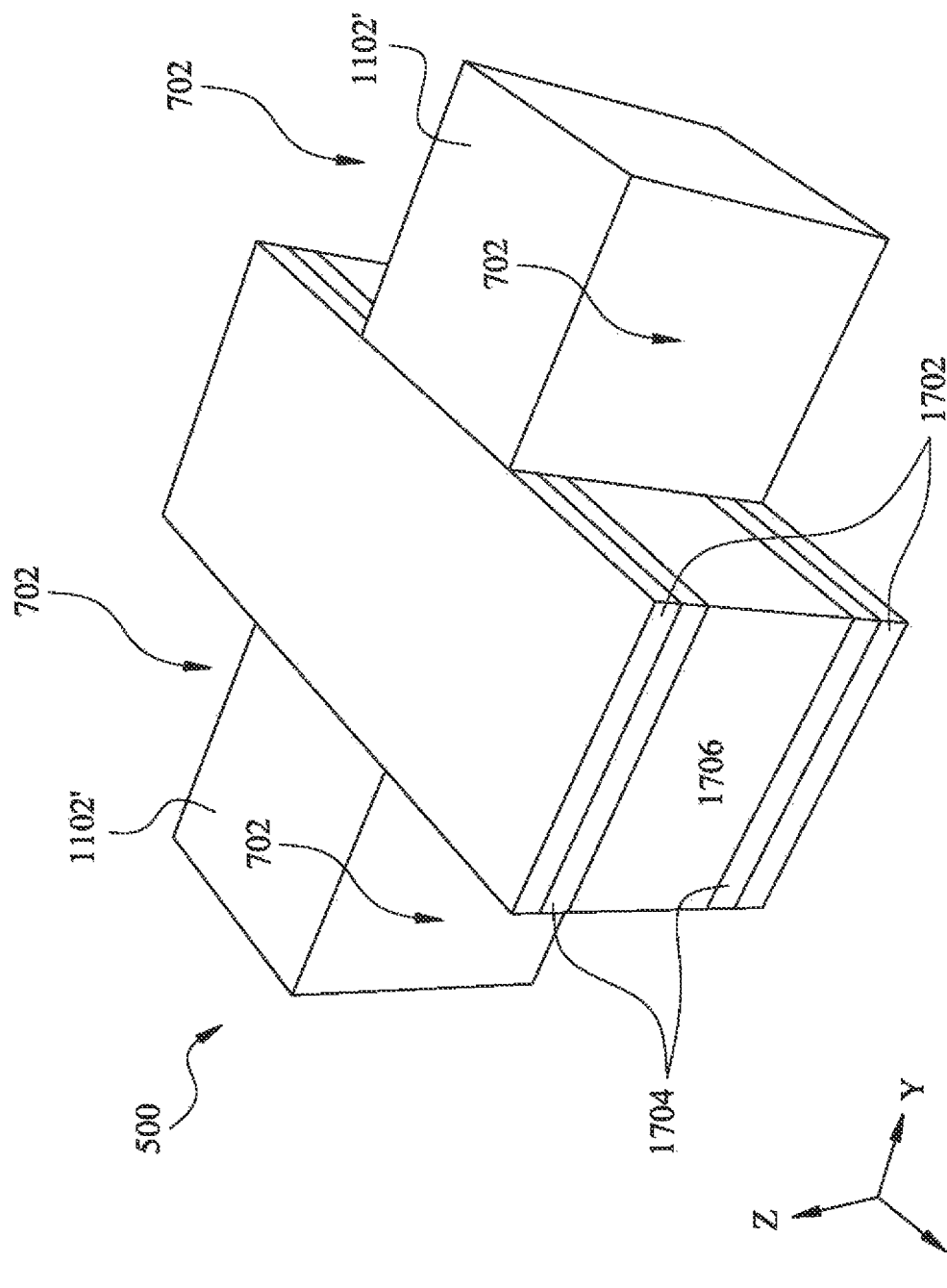

Corresponding to operation 414 of FIG. 4, FIG. 17 illustrates a perspective view of the 3D memory device 300 including semiconductor films 1702, memory films 1704, and conductor structures (e.g., WLs) 1706 at one of the various stages of fabrication, in accordance with various embodiments. FIG. 18 illustrates an enlarged view of a portion of the 3D memory device 500. For example, the portion illustrated in FIG. 18 may correspond to the footprint of one memory cell (or one memory string) of the 3D memory device 500.

In some embodiments, the semiconductor films 1702, memory films 1704, and WLs 1706 shown in FIGS. 17-18 are formed by at least some of the following processes: depositing a (e.g., conformal) semiconductor channel layer over the recesses 1502 and 702; depositing a (e.g., conformal) memory layer over the semiconductor channel layer; depositing a conductive (e.g., metal) material to fill the remaining portions of the recesses 1502 and 702; and etching back portions of the semiconductor channel layer, memory layer, and conductive material in the recesses 702 to form the semiconductor films 1702, memory films 1704, and WLs 1706.

As such, each of the semiconductor films 1702, memory films 1704, and WLs 1706 can extend along the X direction. Each of the semiconductor films 1702, together with a corresponding one of the memory films 1704 and a corresponding one of the WLs 1706, can be disposed in one of the memory levels of the stack 502. Further, each of the semiconductor films 1702 can wrap around portions of a corresponding one of the WLs 1706, with a corresponding one of the memory films 1704 interposed therebetween. Such a wrapped portion of the WL 1706 can correspond to a position of one of the interim dielectric columnar structures 1102'. Alternatively stated, the semiconductor film 1702 has multiple portions, each of which extends along one sidewall of each of the interim dielectric columnar structures 1102' arranged along the X direction. Such a sidewall faces either toward or away from the Y direction. Laterally next to the portions of the semiconductor film 1702 (e.g., in the Y direction), the memory film 1704 has multiple corresponding portions that each wrap around the WL 1706 at the positions of the interim dielectric columnar structures 1102'. Such a wrapped-around configuration can be better appreciated in the cross-sectional view of FIG. 2.

The foregoing semiconductor channel layer, used to form the semiconductor films 1702, may include a doped or undoped semiconductor material such as, for example, Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. The semiconductor channel layer can be deposited (as a blanket layer) over the workpiece as a continuous liner structure, for example, by a conformal deposition method such as atomic layer deposition (ALD) or chemical vapor deposition (CVD). Other deposition methods are within the scope of the present disclosure.

The foregoing memory layer, used to form the memory films 1704, may include a ferroelectric material such as, for example, lead zirconate titanate (PZT), $PbZr/TiO_3$, $BaTiO_3$, $PbTiO_2$, or combinations thereof, in one of various embodiments. However, it should be understood that the memory layer can include any of various other materials that are suitable as in memory devices, while remaining within the scope of the present disclosure. For example, the memory layer can include a material selected from the group consisting of: $HfO_2$, $Hr_{1-x}Zr_xO_2$, $ZrO_2$, $TiO_2$, $NiO$, $TaO_x$, $Cu_2O$, $Nb_2O_5$, $AlO_x$, and combinations thereof. Following the formation of the (blanket) semiconductor channel layer, the memory layer (as a blanket layer) can be deposited over the workpiece as a continuous liner structure, for example, by a conformal deposition method such as atomic layer deposition (ALD) or chemical vapor deposition (CVD). Other deposition methods are within the scope of the present disclosure.

The foregoing metal material, used to form the WLs 1706, may be selected from the group including aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The WLs 1706 can be formed by overlaying the workpiece with the above-listed metal material by, for example, chemical vapor deposition (CVD), physical vapor deposition (PVD), electroless plating, electroplating, or combinations thereof. This can be followed by an etching back process to remove the excess metal material, excess semiconductor channel layer, and excess memory layer in the recesses 702, as mentioned above. Other methods of forming the WLs 1706 are within the scope of the present disclosure.

Figure 19:
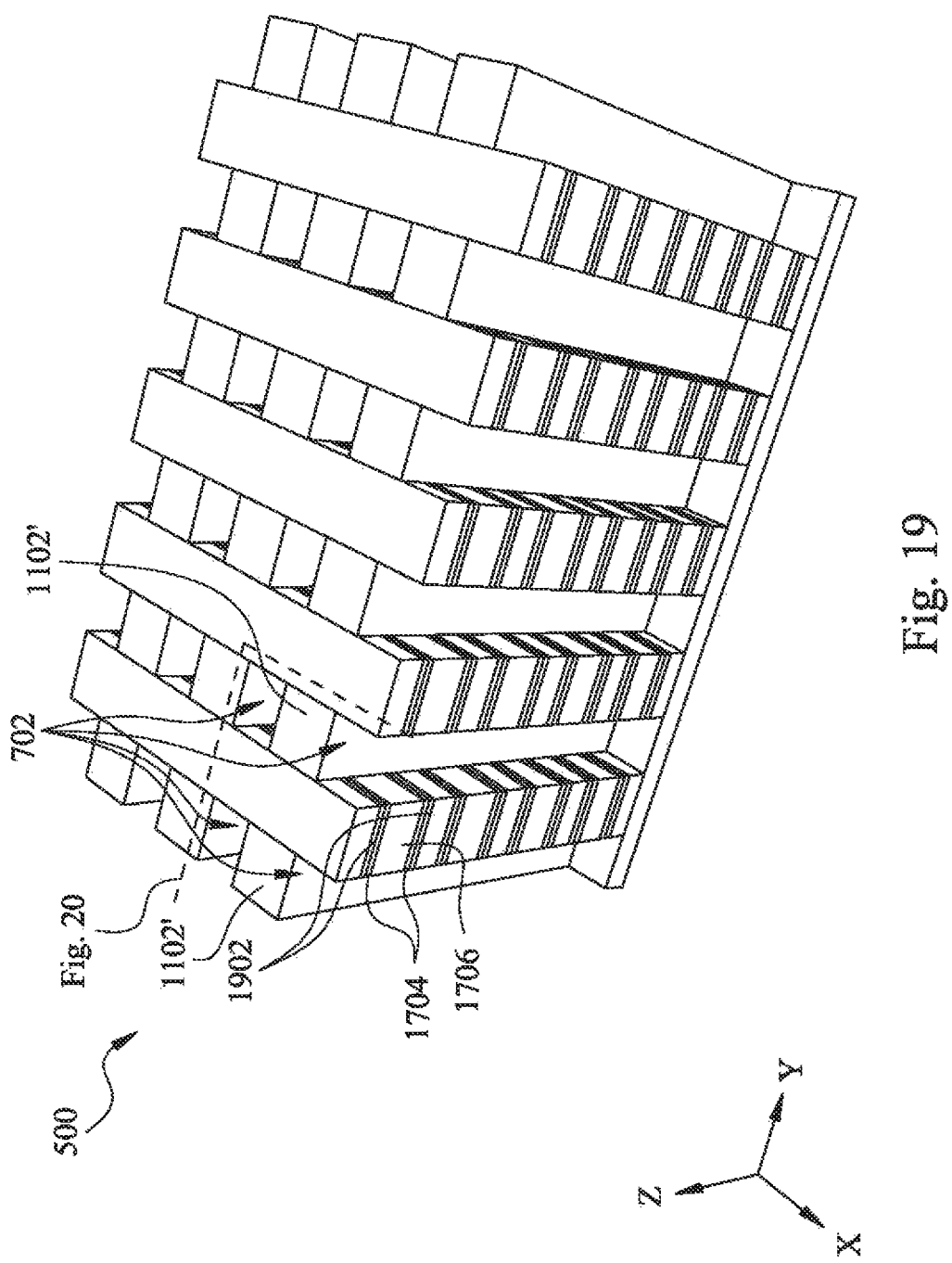
Figure 20:
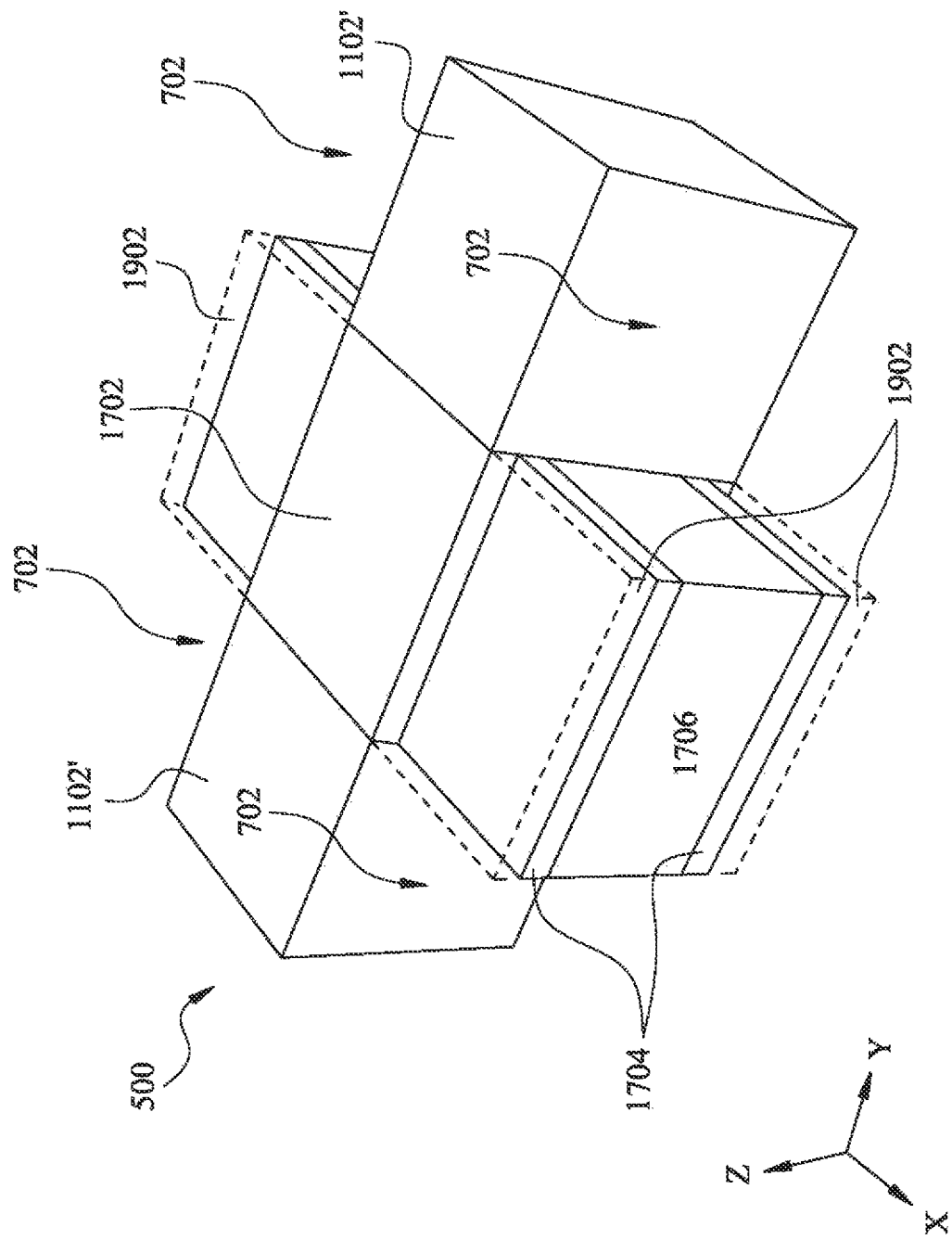

Corresponding to operation 416 of FIG. 4, FIG. 19 illustrates a perspective view of the 3D memory device 300 in which each of the semiconductor films 1702 is etched back at one of the various stages of fabrication, in accordance with various embodiments. FIG. 20 illustrates an enlarged view of a portion of the 3D memory device 500. For example, the portion illustrated in FIG. 19 may correspond to the footprint of one memory cell (or one memory string) of the 3D memory device 500.

In some embodiments, portions of the semiconductor film 1702 that extend beyond any of the interim dielectric columnar structures 1102' along the X direction are etched back (e.g., removed). As such, recesses 1902 are formed. As better seen in FIG. 20, portions of the semiconductor film 1702 that extend beyond the interim dielectric columnar structure 1102' along the X direction are removed, thereby forming the recesses 1902. As such, the memory film 1704 and WL 1706 may each extend beyond the etched (or otherwise patterned) semiconductor film 1702 along the X direction. However, it should be noted that the remaining portion of the semiconductor film 1702 may still wrap around a portion of the WL 1706 with a portion of the memory film 1704 interposed therebetween, as illustrated in FIG. 2.

Figure 21:
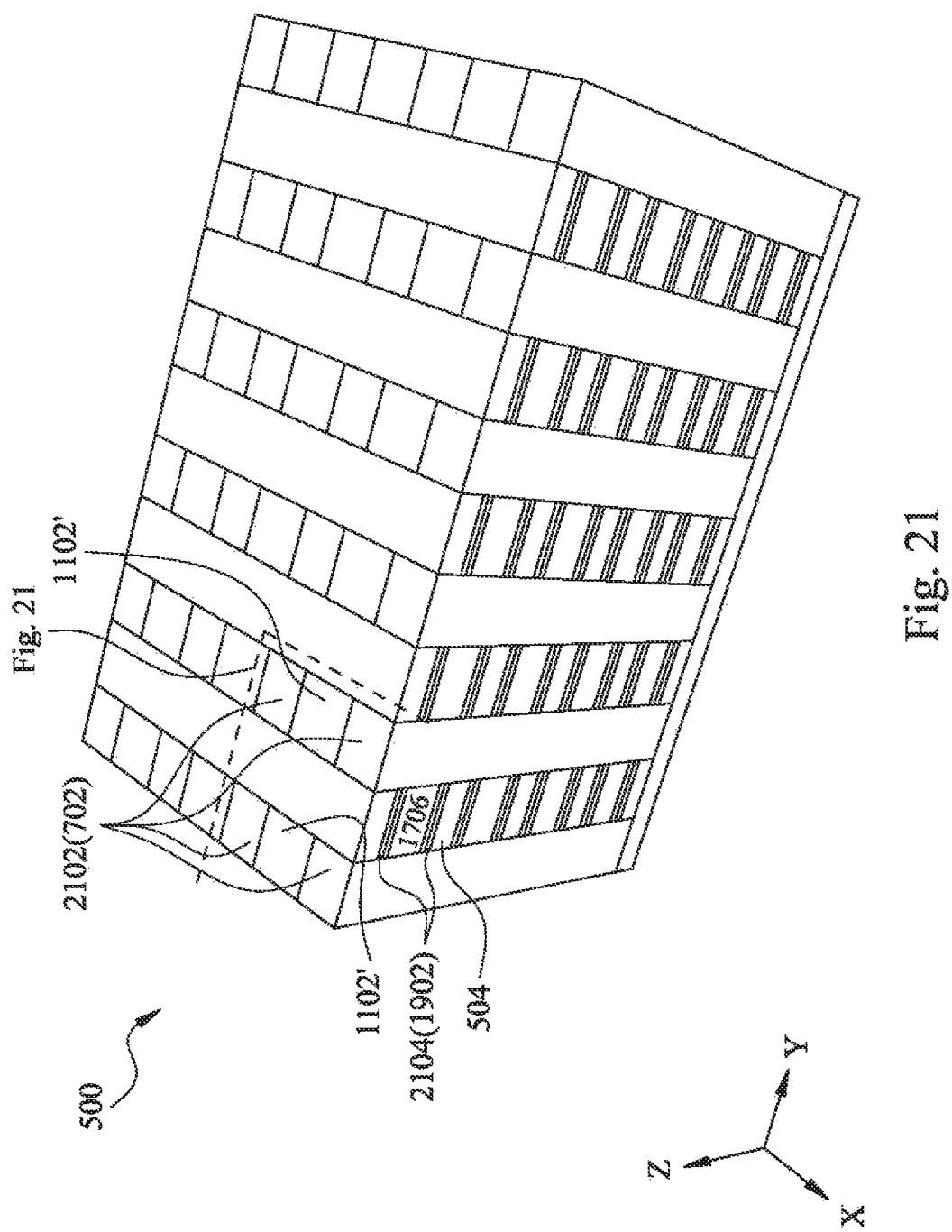
Figure 22:
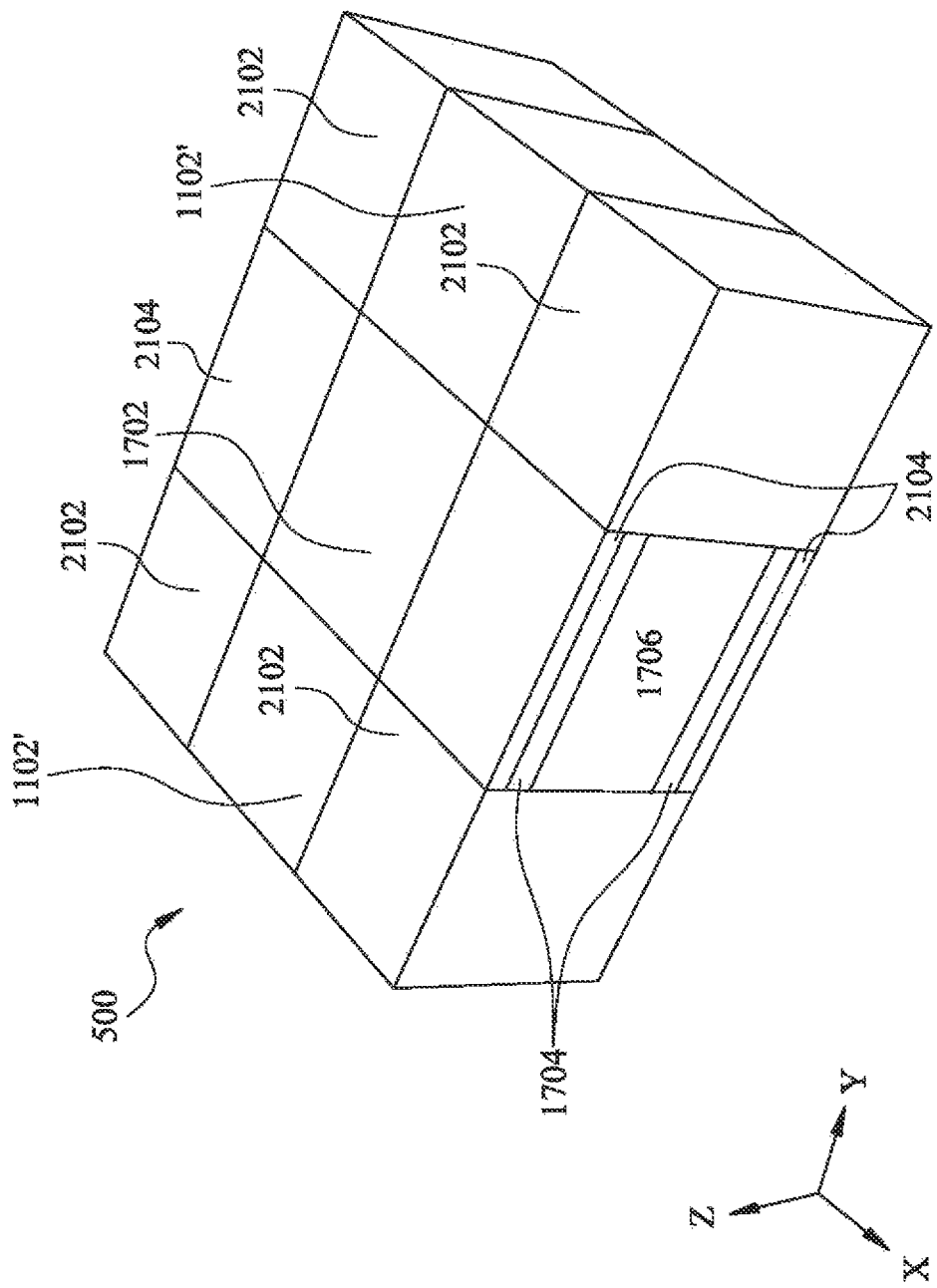

Corresponding to operation 418 of FIG. 4, FIG. 21 illustrates a perspective view of the 3D memory device 300 in which in which the recesses 702 and 1902 are refilled at one of the various stages of fabrication, in accordance with various embodiments. FIG. 22 illustrates an enlarged view of a portion of the 3D memory device 500. For example, the portion illustrated in FIG. 21 may correspond to the footprint of one memory cell (or one memory string) of the 3D memory device 500.

In some embodiments, the first columnar recesses 702 and recesses 1902 can be refilled with a second insulating material, for example, by a conformal deposition method such as atomic layer deposition (ALD) or chemical vapor deposition (CVD). Other deposition methods are within the scope of the present disclosure. The second insulating material may be similar as the material of the insulating layers 504, according to various embodiments. As a result, the interim dielectric columnar structures 1102' can be interposed between a pair of dielectric columnar structures 2102 that inherit the profiles and dimensions of the corresponding pair of first columnar recesses 702, as shown in FIGS. 21-22. Further, dielectric structures 2104 that inherit the profiles and dimensions of the recesses 1902 can be formed. Such dielectric structures 2104 can (e.g., electrically) isolate each of the semiconductor films 1702 from another, e.g., along the X direction.

Figure 23:
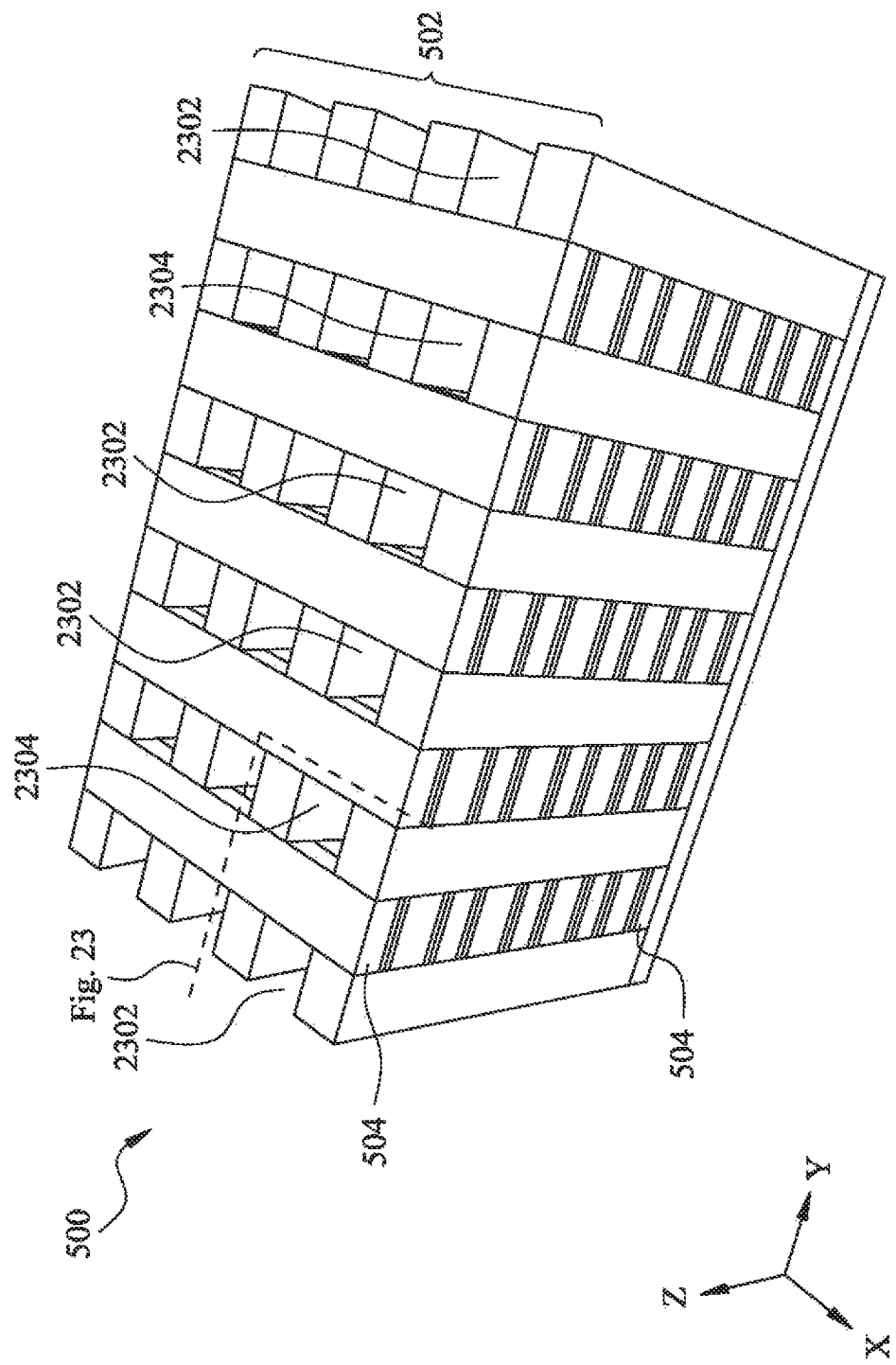
Figure 24:
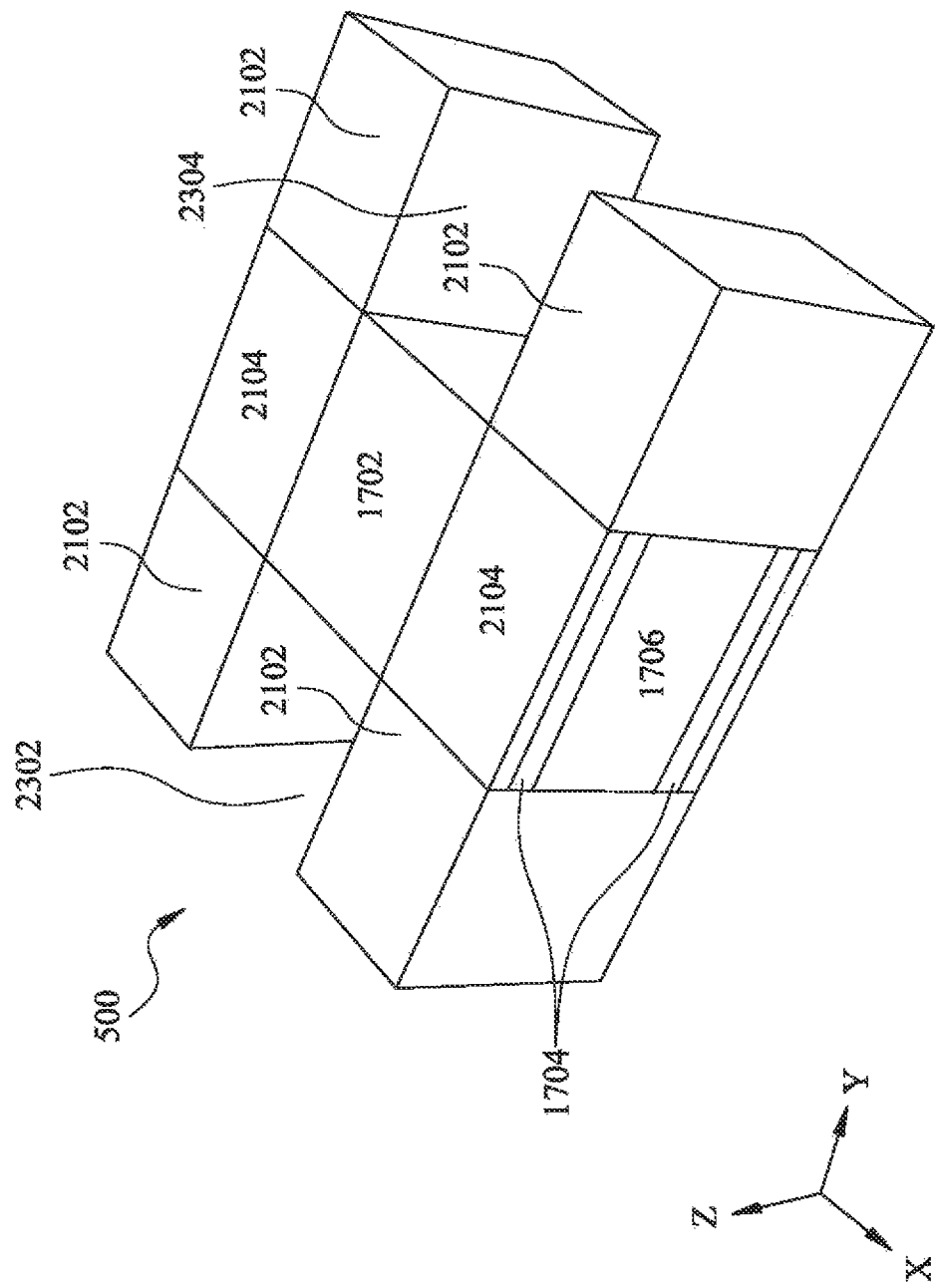

Corresponding to operation 420 of FIG. 4, FIG. 23 illustrates a perspective view of the 3D memory device 300 including a number of recesses 2302 and a number of recesses 2304 at one of the various stages of fabrication, in accordance with various embodiments. FIG. 24 illustrates an enlarged view of a portion of the 3D memory device 500. For example, the portion illustrated in FIG. 24 may correspond to the footprint of one memory cell (or one memory string) of the 3D memory device 500.

The recesses 2302 will be later refilled with a conductive material to form a number of BLs, and thus, the recesses 2302 are herein referred to as "BL recesses 2302." Similarly, the recesses 2304 will be later refilled with the same conductive material to form a number of SLs, and thus, the recesses 2304 are herein referred to as "SL recesses 2304." The BL recesses 2302 and SL recesses 2304 each vertically extend through the stack 502, e.g., from the bottommost insulating layers 504 to the topmost insulating layers 504.

Further, in some embodiments, the BL recesses 2302 and SL recesses 2404 may be formed by etching (or otherwise removing) the interim dielectric columnar structures 1102'. As such, upon being formed, such a pair of the BL recess 2302 and SL recess 2304 can expose sidewalls of one of the "isolated" semiconductor films 902, respectively. As better appreciated in FIG. 24, following the formation of the BL recess 2302 and SL recess 2304, the sidewalls of the semiconductor film 1702, facing toward or away from the Y direction, are exposed. In addition, each of the BL recesses 2302 and SL recesses 2304 is interposed between a pair of the dielectric columnar structures 2102 along the X direction.

According to various embodiments of the present disclosure, the BL recesses 2302 and SL recesses 2304 may be formed in a manner such that each SL recess 2304 is interposed between a respective pair of the BL recesses 2302 along the Y direction, as illustrated in FIG. 23. Accordingly, the BLs and SLs, later filling the BL and SL recesses, can be arranged in the same manner. In this way, neighboring memory strings can share a common SL (thereby forming a number of common-source memory cells), which will be described as follows.

Figure 25:
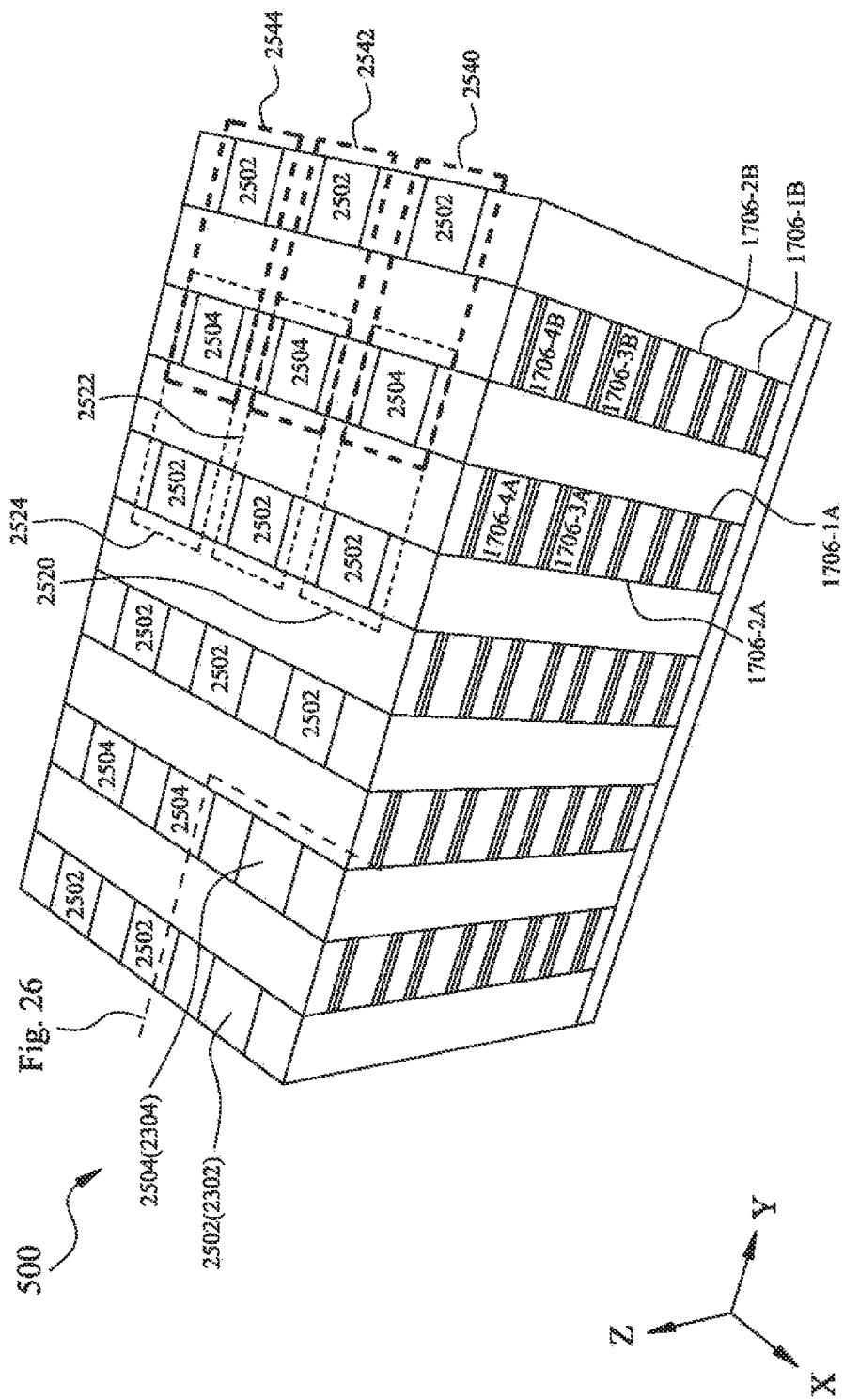
Figure 26:
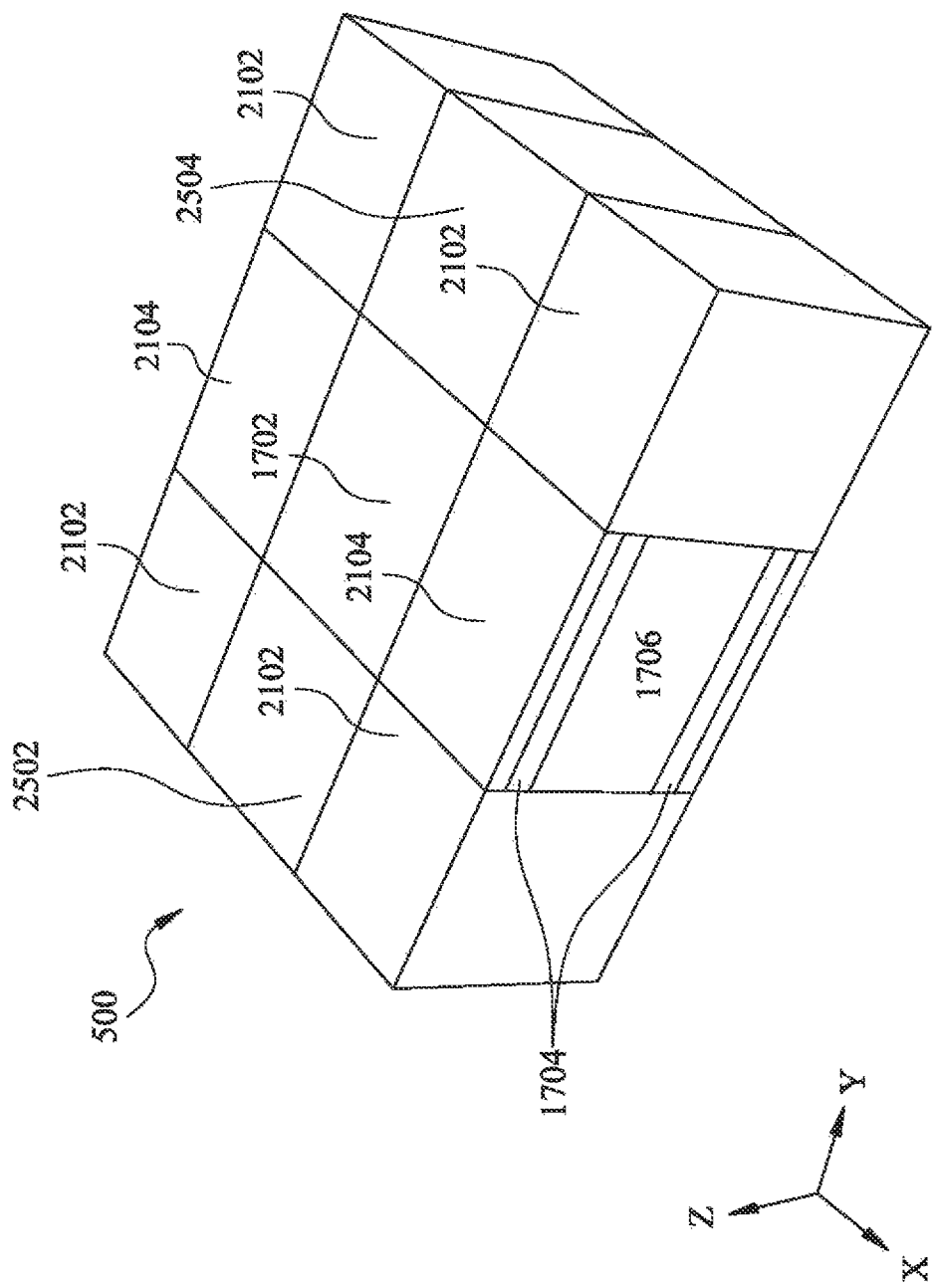

Corresponding to operation 422 of FIG. 4, FIG. 25 illustrates a perspective view of the 3D memory device 300 including conductor structures (e.g., BLs) 2502 and conductor structures (e.g., SLs) 2504 at one of the various stages of fabrication, in accordance with various embodiments. FIG. 26 illustrates an enlarged view of a portion of the 3D memory device 500. For example, the portion illustrated in FIG. 26 may correspond to the footprint of one memory cell (or one memory string) of the 3D memory device 500.

As mentioned above, the BLs 2502 and SLs 2504 are formed by refilling the recesses 2302 and 2304 with a conductive material, respectively. Such a conductive material can include a metal material or a semiconductor material. The example metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. Non-limiting examples of such a semiconductor material include Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. The BLs 2502 and SLs 2504 can be formed by overlaying the workpiece (e.g., to fill the BL and SL recesses) with the above-listed metal or semiconductor material by, for example, chemical vapor deposition (CVD), physical vapor deposition (PVD), electroless plating, electroplating, or combinations thereof. This can be followed by a CHIP process. Other methods of forming the BLs and SLs are within the scope of the present disclosure.

Upon forming the BLs 2502 and SLs 2504, a three-dimensional (3D) memory array including a number of memory strings can be formed. As shown in FIG. 25, memory strings 2520, 2522, 2524, 2540, 2542, and 2544 are selected as representative examples. It should be understood that the 3D memory array can include any number of memory strings, while remaining within the scope of the present disclosure.

Each of the memory strings has a number of memory cells, each of which is disposed in a respective memory level with a corresponding WL 1706. For example, the memory strings 2520 to 2524, disposed along the X direction (i.e., a lengthwise direction of the WLs 1706), each have four memory cells disposed in respective memory levels. As such, a first level of the memory strings 2520 to 2524 share WL 1706-1A, a second level of the memory strings 2520 to 2524 share WL 1706-2A, a third level of the memory strings 2520 to 2524 share WL 1706-3A, and a fourth level of the memory strings 2520 to 2524 share WL 1706-4A. Alternatively stated, each of the memory strings 2520 to 2524 has a first memory cell gated by the WL 1706-1A, a second memory cell gated by the WL 1706-2A, a third memory cell gated by the WL 1706-3A, and a fourth memory cell gated by the WL 1706-4A, while the respective memory cells of the memory strings 2520 to 2524 at a certain memory level share one of the WLs 1706-1A to 1706-4A. Similarly, the memory strings 2540 to 2544, disposed along the X direction, each have four memory cells disposed in respective memory levels. As such, a first level of the memory strings 2540 to 2544 share WL 1706-1B, a second level of the memory strings 2540 to 2544 share WL 1706-2B, a third level of the memory strings 2540 to 2544 share WL 1706-3B, and a fourth level of the memory strings 2540 to 2544 share WL 1706-4B.

Further, the memory strings, disposed adjacent each other along the Y direction, share one of the SLs 2504, while having their own BLs 2502. For example, the memory strings 2520 and 2540 share one of the SLs 2504, while having their own BLs 2502; the memory strings 2522 and 2542 share one of the SLs 2504, while having their own BLs 2502; and the memory strings 2524 and 2544 share one of the SLs 2504, while having their own BLs 2502. As such, each memory string has its BL and SL disposed on opposite sides of its WLs along the Y direction, with the SL shared by another memory string disposed next to the memory string along the Y direction. Alternatively stated, adjacent memory strings of the memory device 500 along the Y direction have a common SL interposed therebetween, while having their own BLs disposed opposite their WLs from the common SL.

FIGS. 27, 28, 29, and 30 illustrate various other embodiments of a portion of the memory device 500, respectively, in the cross-section cut along the Y-Z plane and across two BLs 2502, two WLs 1706A and 1706B, and one SL 2504 (similar as FIG. 2). In other words, the portion of the memory device 500 illustrated in FIGS. 27 through 30 includes two disclosed memory cells that are disposed next to each other and share a common SL. For example, one (e.g., the left) of the memory cells includes the WL 1706A, memory film 1704A, semiconductor film 1702A, the left BL 2502, and the SL 2504; and the other (e.g., the right) of the memory cells includes the WL 1706B, memory film 1704B, semiconductor film 1702B, the right BL 2502, and the SL 2504.

Figure 27:
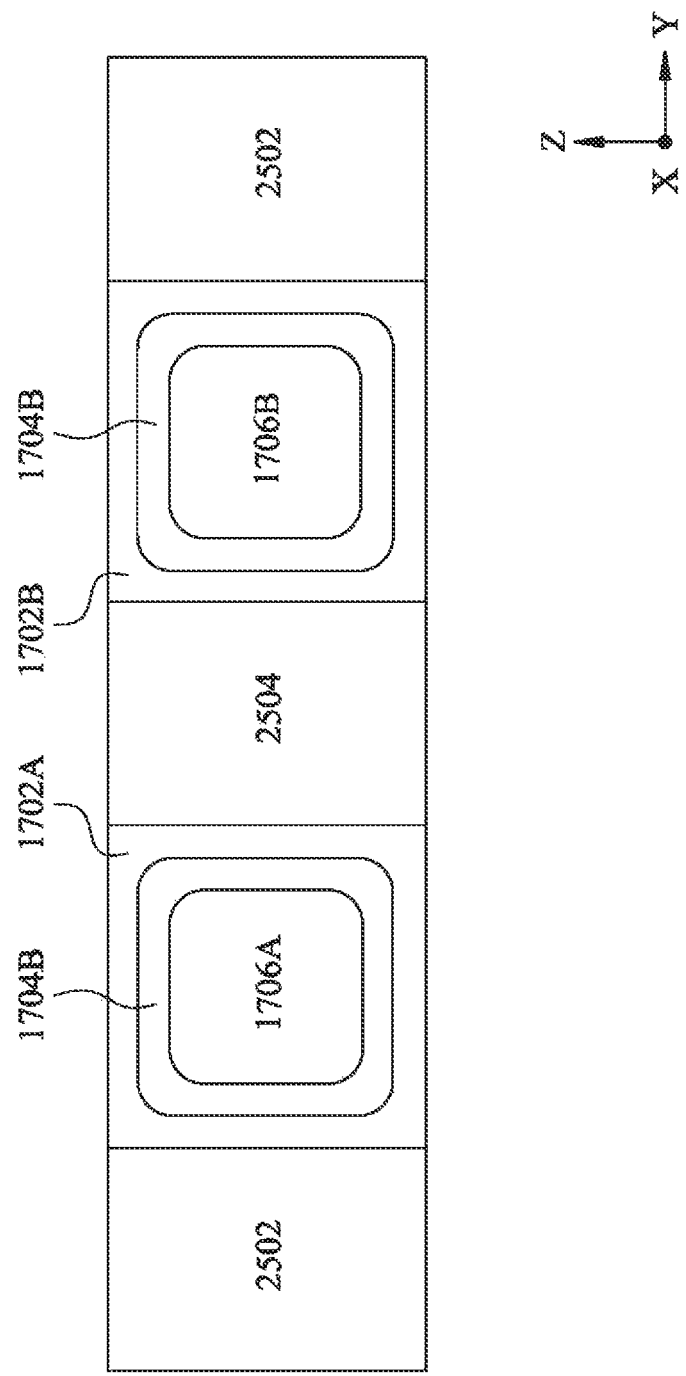
FIGS. 27, 28, 29, and 30 illustrate various cross-sectional views of a portion of the example three-dimensional memory device shown in FIGS. 5 to 26, in accordance with some embodiments.

In the example of FIG. 27, each of the semiconductor films 1702A-B, each of the memory films 1704A-B, and each of the WLs 1706A-B have at least one of its inner and/or outer corners with a curvature profile. Specifically, four inner corners of the semiconductor film 1702A/B each present a curvature profile; four inner and outer corners of the memory film 1704A/B each present a curvature profile; and four outer corners of the WLs 1706A/B each present a curvature profile. Such a curvature profile may be formed during the sequential depositions of the above-mentioned semiconductor layer, memory layer, and the WL metal. For example, after the semiconductor layer (which is later patterned to become the semiconductor film 1702) is formed as having inner corners present the curvature profile, the memory layer (which is later patterned to become the memory film 1704) and the WL metal (which is later patterned to become the WL 1706) may follow such a curvature profile.

Figure 28:
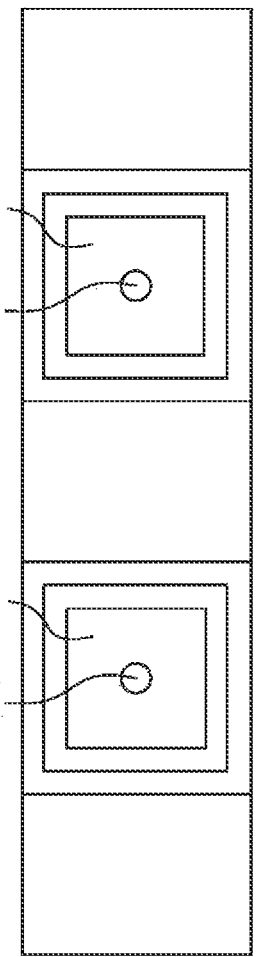
Figure 29:
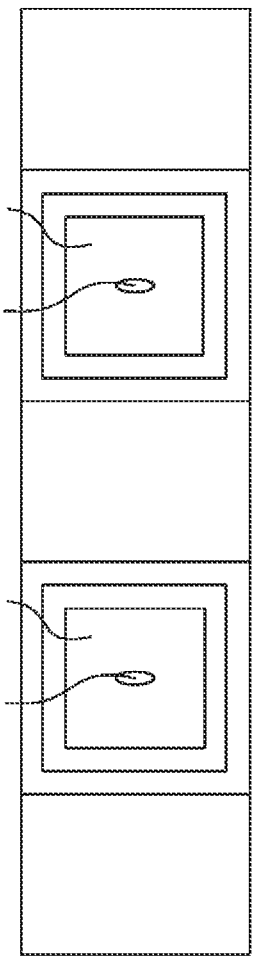
Figure 30:
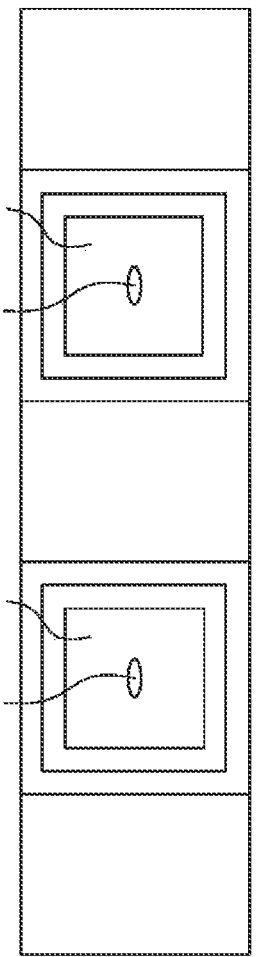

Next, in each of FIGS. 28-30, the WL 1706A/B has a void (e.g., filled with air) embedded therein. For example, in FIG. 28, the WL 1706A/B has a void 2802 in a circle shape; in FIG. 29, the WL 1706A/B has a void 2902 in an ellipse shape having its long axis along the Z direction; and in FIG. 30, the WL 1706A/B has a void 3002 in an ellipse shape having its long axis along the Y direction. Such a void may be formed during the deposition of the WL metal, where the recess 1502 (FIGS. 17-18) may not be fully filled with the WL metal. Alternatively stated, the void can be "spontaneously" formed within a formed WL. Thus, it should be understood that the void can have any of various other shapes (e.g., an irregular shape, an ellipse shape having its long axis along a direction between the Z direction and Y direction, a rectangle shape, etc.) and/or be formed within any position of a WL, while remaining within the scope of the present disclosure.

Figure 31:
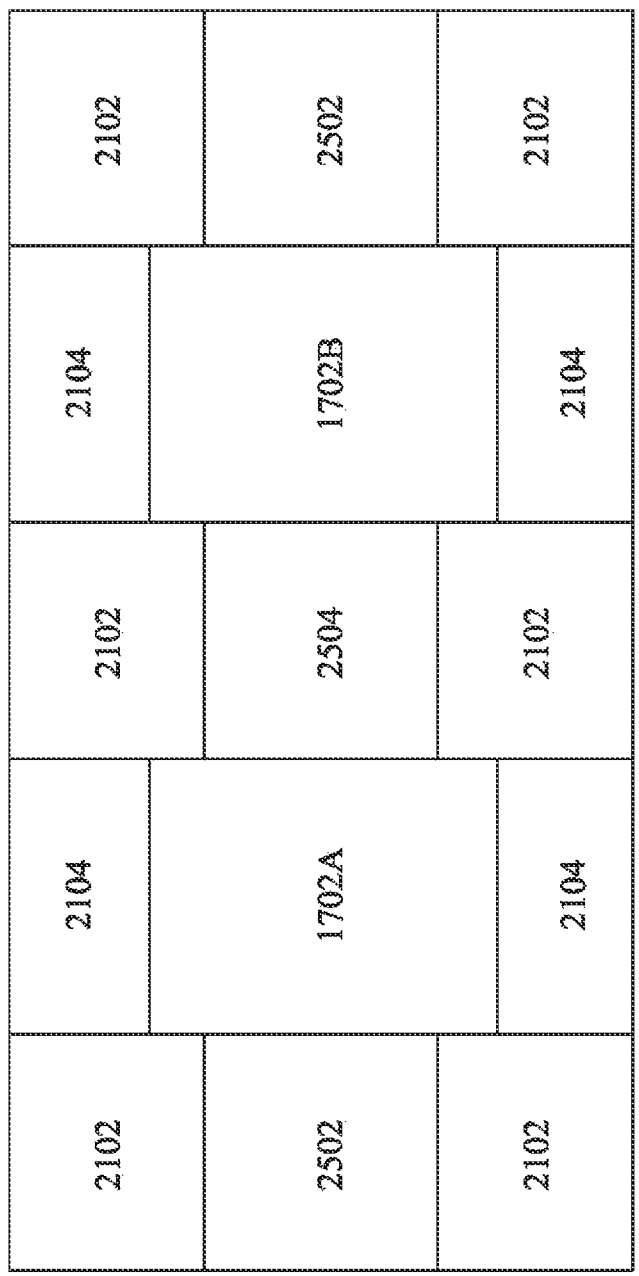
FIGS. 31 and 32 illustrate various cross-sectional views of a portion of the example three-dimensional memory device shown in FIGS. 5 to 26, in accordance with some embodiments.
Figure 32:
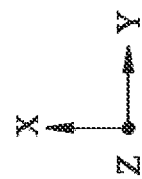

FIGS. 31 and 32 illustrate various other embodiments of a portion of the memory device 500, respectively, in the cross-section cut along the X-Y plane and across two BLs 2502, two semiconductor films 1702, and one SL 2504. Further, such a cross-section is cut across a plane where no WLs 1706 or memory films 1704 are formed, i.e., across the dielectric structures 2104. In other words, the portion of the memory device 500 illustrated in FIGS. 31 and 32 includes two disclosed memory cells that are disposed next to each other and share a common SL. For example, one (e.g., the left) of the memory cells includes semiconductor film 1702A, the left BL 2502, and the SL 2504; and the other (e.g., the right) of the memory cells includes semiconductor film 1702B, the right BL 2502, and the SL 2504.

As shown in FIGS. 31-32, sidewalls of the semiconductor film 1702A/B that face toward or away from the X direction may be offset from sidewalls of the BL 2502/SL 2504 that face toward or away from the same direction. For example in FIG. 31, the sidewalls of the semiconductor film 1702A/B are outwardly shifted beyond the sidewalls of the BL 2502 and SL 2504, respectively; and in FIG. 32, the sidewalls of the semiconductor film 1702A/B are inwardly shifted beyond the sidewalls of the BL 2502 and SL 2504, respectively.

In one aspect of the present disclosure, a semiconductor device is disclosed. The semiconductor device includes a first memory cell that includes: a first conductor structure extending along a first lateral direction; a first portion of a first memory film wrapping around a first portion of the first conductor structure; a first semiconductor film wrapping around the first portion of the first memory film; a second conductor structure extending along a vertical direction and coupled to a first sidewall of the first semiconductor film, wherein the first sidewall faces toward or away from a second lateral direction perpendicular to the first lateral direction; and a third conductor structure extending along the vertical direction and coupled to a second sidewall of the first semiconductor film, wherein the second sidewall faces toward or away from the second lateral direction.

In another aspect of the present disclosure, a memory device is disclosed. The memory device includes a memory array comprising a plurality of memory strings disposed apart from each other, a first one and a second one of the memory strings sharing a first conductor structure that extends along a vertical direction. The first memory string includes: a plurality of second conductor structures each extending along a first lateral direction; a third conductor structure extending along the vertical direction; and a plurality of first semiconductor films each wrapping around a corresponding one of the plurality of second conductor structures. The second memory string includes: a plurality of fourth conductor structures each extending along the first lateral direction; a fifth conductor structure extending along the vertical direction; and a plurality of second semiconductor films each wrapping around a corresponding one of the plurality of fourth conductor structures.

In yet another aspect of the present disclosure, a method for fabricating memory devices is disclosed. The method includes forming a first dielectric structure and second dielectric structure each extending along a lateral direction, wherein the first and second dielectric structures are separated apart from each other along a vertical direction. The method includes forming a third dielectric structure and a fourth dielectric structure each extending along the vertical direction, wherein the third and fourth dielectric structures are disposed on opposite sides of the first and second dielectric structures, respectively. The method includes forming a first semiconductor layer extending along the lateral direction and in contact with at least a bottom surface of the first dielectric structure, a top surface of the second dielectric structure, a sidewall of the third dielectric structure, and a sidewall of the fourth dielectric structure. The method includes forming a first conductor structure extending along the lateral direction, wherein the first conductor structure is wrapped by the first semiconductor layer. The method includes replacing the third dielectric structure and fourth dielectric structure with a second conductor structure and third conductor structure, respectively.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first memory cell comprising:
      a first conductor structure extending along a first lateral direction;
      a first portion of a first memory film wrapping around a first portion of the first conductor structure;
      a first semiconductor film wrapping around the first portion of the first memory film;
      a second conductor structure extending along a vertical direction and directly contacting a first sidewall of the first semiconductor film, wherein the first sidewall of the first semiconductor film faces toward or away from a second lateral direction perpendicular to the first lateral direction; and
      a third conductor structure extending along the vertical direction and directly contacting a second sidewall of the first semiconductor film, wherein the second sidewall of the first semiconductor film faces toward or away from the second lateral direction.

2. The semiconductor device of claim 1, further comprising a second memory cell that comprises:
   a fourth conductor structure extending along the first lateral direction;
   a first portion of a second memory film wrapping around a first portion of the fourth conductor structure;
   a second semiconductor film wrapping around the first portion of the second memory film;
   the third conductor structure directly contacting a first sidewall of the second semiconductor film, wherein the first sidewall of the second semiconductor film faces toward or away from the second lateral direction; and
   a fifth conductor structures extending along the vertical direction and directly contacting a second sidewall of the second semiconductor film, wherein the second sidewall of the second semiconductor film faces toward or away from the second lateral direction.

3. The semiconductor device of claim 2, wherein the third conductor structure is configured as a common source line shared by the first memory cell and the second memory cell.

4. The semiconductor device of claim 2, wherein the second conductor structure, the third conductor structure, and the fifth conductor structure are aligned with respect to one another along the second lateral direction.

5. The semiconductor device of claim 1, wherein the first memory film comprises a second portion that is in contact with both a top surface and a bottom surface of a second portion of the first conductor structure.

6. The semiconductor device of claim 5, wherein the second portion of the first conductor structure and the second portion of the first memory film each extend beyond a third sidewall of the first semiconductor film that faces toward or away from the first lateral direction.

7. The semiconductor device of claim 1, wherein the first semiconductor film comprises at least a first portion and a second portion disposed above and below the first portion of the first conductor structure, respectively, that are each configured to conduct a current.

8. The semiconductor device of claim 7, wherein the current flows from the second conductor structure to the third conductor structure.

9. The semiconductor device of claim 1, further comprising a third memory cell that comprises:
   the first conductor structure;
   a third portion of the first memory film wrapping around a third portion of the first conductor structure;
   a third semiconductor film wrapping around the third portion of the first memory film;
   a sixth conductor structure extending along the vertical direction and coupled to a first sidewall of the third semiconductor film, wherein the first sidewall of the third semiconductor film faces toward or away from the second lateral direction; and
   a seventh conductor structure extending along the vertical direction and coupled to a second sidewall of the third semiconductor film, wherein the second sidewall of the third semiconductor film faces toward or away from the second lateral direction.

10. The semiconductor device of claim 1, wherein the first conductor structure has a void.

11. A memory device, comprising:
a memory array comprising a plurality of memory strings disposed apart from each other, a first one and a second one of the memory strings sharing a first conductor structure that extends along a vertical direction;
wherein the first memory string comprises:
a plurality of second conductor structures each extending along a first lateral direction;
a third conductor structure extending along the vertical direction; and
a plurality of first semiconductor films each wrapping around each surface of a corresponding one of the plurality of second conductor structures in a cross-sectional view; and
wherein the second memory string comprises:
a plurality of fourth conductor structures each extending along the first lateral direction;
a fifth conductor structure extending along the vertical direction; and
a plurality of second semiconductor films each wrapping around each surface of a corresponding one of the plurality of fourth conductor structures in the cross-sectional view.

12. The memory device of claim 11, wherein the third conductor structure is disposed opposite the plurality of first semiconductor films from the first conductor structure along a second lateral direction perpendicular to the first lateral direction, and wherein the fifth conductor structure is disposed opposite the plurality of second semiconductor films from the first conductor structure along the second lateral direction.

13. The memory device of claim 11, wherein the plurality of second conductor structures are separated from one another along the vertical direction, and the plurality of fourth conductor structures are separated from one another along the vertical direction.

14. The memory device of claim 11, wherein the plurality of first semiconductor films are separated from one another along the vertical direction, and the plurality of second semiconductor films are separated from one another along the vertical direction.

15. The memory device of claim 11, wherein the first conductor structure, third conductor structure, and fifth conductor structure are aligned with respect to one another along a second lateral direction perpendicular to the first lateral direction.

16. The memory device of claim 11, wherein at least one of the plurality of second conductor structures or the plurality of fourth conductor structures has a void.

17. The memory device of claim 11, wherein the first and third conductor structures are in direct contact with sidewalls of each of the plurality of first semiconductor films, and the first and fifth conductor structures are in direct contact with sidewalls of each of the plurality of second semiconductor films.

18. A semiconductor device, comprising:
a first memory cell comprising:
a first word line (WL) extending along a first lateral direction;
a first portion of a first memory film wrapping around a first portion of the first WL;
a first channel wrapping around the first portion of the first memory film;
a first bit line (BL) extending along a vertical direction and directly contacting a first sidewall of the first channel, wherein the first sidewall of the first channel faces toward or away from a second lateral direction perpendicular to the first lateral direction; and
a common source line (SL) extending along the vertical direction and directly contacting a second sidewall of the first channel, wherein the second sidewall of the first channel faces toward or away from the second lateral direction.

19. The semiconductor device of claim 18, further comprising a second memory cell that comprises:
a second WL extending along the first lateral direction;
a first portion of a second memory film wrapping around a first portion of the second WL;
a second channel wrapping around the first portion of the second memory film;
the common SL directly contacting a first sidewall of the second channel, wherein the first sidewall of the second channel faces toward or away from the second lateral direction; and
a second BL extending along the vertical direction and directly contacting a second sidewall of the second channel, wherein the second sidewall of the second channel faces toward or away from the second lateral direction.

20. The semiconductor device of claim 18, wherein the first memory film includes a ferroelectric material.

* * * * *